(12) United States Patent
Wang et al.

(10) Patent No.: US 10,826,398 B2
(45) Date of Patent: Nov. 3, 2020

(54) APPARATUS AND METHODS FOR SENSING A VARIABLE AMPLITUDE SWITCHING SIGNAL FROM A SECONDARY WINDING IN A POWER CONVERSION SYSTEM

(71) Applicant: Power Integrations, Inc., San Jose, CA (US)

(72) Inventors: Zhao-Jun Wang, San Jose, CA (US); Qing McIntosh, Los Gatos, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 16/217,914

(22) Filed: Dec. 12, 2018

(65) Prior Publication Data

US 2020/0195163 A1 Jun. 18, 2020

(51) Int. Cl.
*H02M 3/335* (2006.01)
*H03K 5/24* (2006.01)
*H02M 1/00* (2006.01)
*H02M 7/217* (2006.01)

(52) U.S. Cl.
CPC .......... *H02M 3/335* (2013.01); *H03K 5/2472* (2013.01); *H02M 7/217* (2013.01); *H02M 2001/0006* (2013.01); *H02M 2001/0009* (2013.01); *H02M 2001/0025* (2013.01)

(58) Field of Classification Search
CPC ......... H02M 2001/0025; H02M 3/335; H02M 3/33507; H02M 3/33523; H02M 3/33569; H02M 3/33576; H02M 3/33592; H02M 2001/0009
See application file for complete search history.

(56) References Cited

U.S. PATENT DOCUMENTS

| | | | |
|---|---|---|---|
| 6,348,783 B2 * | 2/2002 | Tateishi | H02M 3/156 323/284 |
| 7,092,266 B2 * | 8/2006 | Frank | G05F 1/70 363/65 |
| 8,077,484 B2 | 12/2011 | Djenguerian et al. | |
| 9,136,765 B2 | 9/2015 | Balakrishnan et al. | |
| 9,166,486 B2 | 10/2015 | Matthews et al. | |
| 9,312,777 B2 | 4/2016 | Lefedjiev et al. | |
| 9,374,011 B2 | 6/2016 | Liu et al. | |
| 9,502,985 B2 | 11/2016 | Werner et al. | |
| 9,742,288 B2 | 8/2017 | Balakrishnan et al. | |
| 9,762,129 B2 | 9/2017 | Balakrishnan et al. | |
| 9,780,666 B2 * | 10/2017 | Odell | H02M 3/33507 |
| 10,505,458 B1 * | 12/2019 | Pastore | H02M 1/0061 |
| 2016/0268909 A1 | 9/2016 | Liu et al. | |
| 2017/0288557 A1 | 10/2017 | Fang et al. | |
| 2018/0159434 A1 | 6/2018 | Werner et al. | |
| 2018/0351463 A1 | 12/2018 | Werner et al. | |
| 2018/0358902 A1 | 12/2018 | Duvnjak | |

* cited by examiner

*Primary Examiner* — Gary L Laxton
(74) *Attorney, Agent, or Firm* — Brian H. Floyd

(57) ABSTRACT

Apparatus and methods for sensing a variable amplitude switching signal from a secondary winding in a power conversion system are disclosed herein. By using a comparator with an adaptable reference, variable amplitude secondary winding signals in phase with primary winding signals may be detected in the presence of ringing. Detection of the in phase secondary winding signals, in turn, allows for secondary side control with power factor correction and discontinuous mode operation.

33 Claims, 18 Drawing Sheets

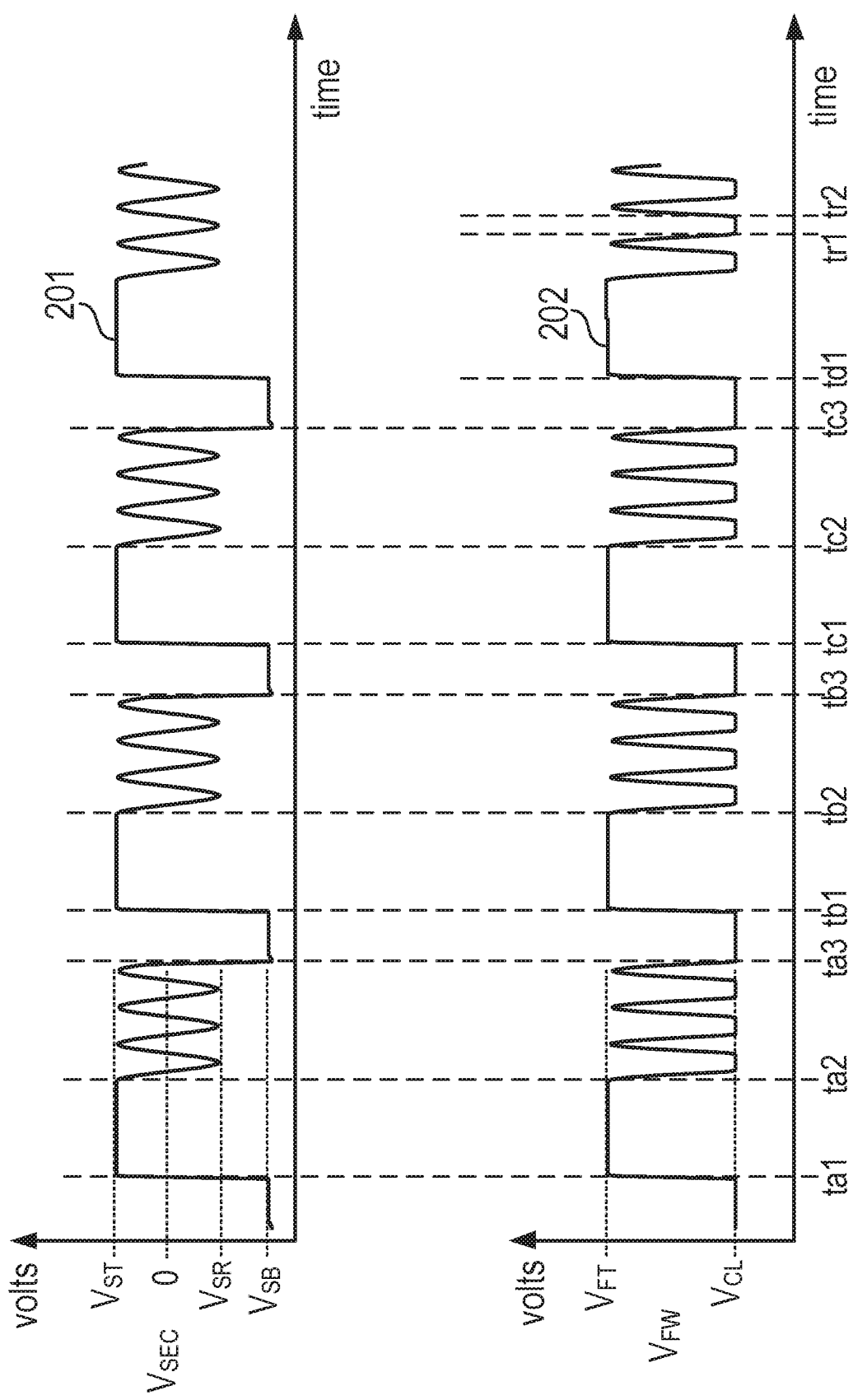

APPARATUS AND METHODS FOR SENSING A VARIABLE AMPLITUDE SWITCHING SIGNAL FROM A SECONDARY WINDING IN A POWER CONVERSION SYSTEM

FIELD OF THE DISCLOSURE

The present invention relates to sensing a variable amplitude switching signal from a secondary winding in a power conversion system and more particularly to sensing a variable amplitude switching signal from a secondary winding in a flyback converter.

BACKGROUND INFORMATION

Many electronic devices, such as cell phones, laptops, etc., are powered by direct current (dc) power derived from a power supply. Conventional wall outlets generally deliver a high voltage alternating current (ac) power that needs to be converted to regulated dc power in order to be used as a power source for consumer electronic devices. In some applications a power conversion system may cascade or include one or more power converter stages. For instance, a power conversion system may include a power factor correction (PFC) stage using a switch mode power converter. Switch mode power converters are commonly used due to their high efficiency, small size, and low weight to convert a high voltage ac power to a regulated dc power.

One topology of switch mode power converter is a flyback converter. The flyback converter uses a switching transformer to transfer switched energy from a primary winding to a secondary winding and, like other power converter topologies, can be operated in a continuous or discontinuous mode. In discontinuous mode energy is fully depleted from the secondary winding; and compared with operating in continuous mode, operating in discontinuous mode can advantageously simplify system loop compensation.

BRIEF DESCRIPTION OF THE DRAWINGS

Non-limiting and non-exhaustive embodiments for sensing a variable amplitude switching signal from a secondary winding in a power conversion system are described with reference to the following figures, wherein like reference numerals refer to like parts throughout the various views unless otherwise specified.

FIG. 2A illustrates waveforms of a secondary winding signal and a secondary signal according to an embodiment.

Figure 1:
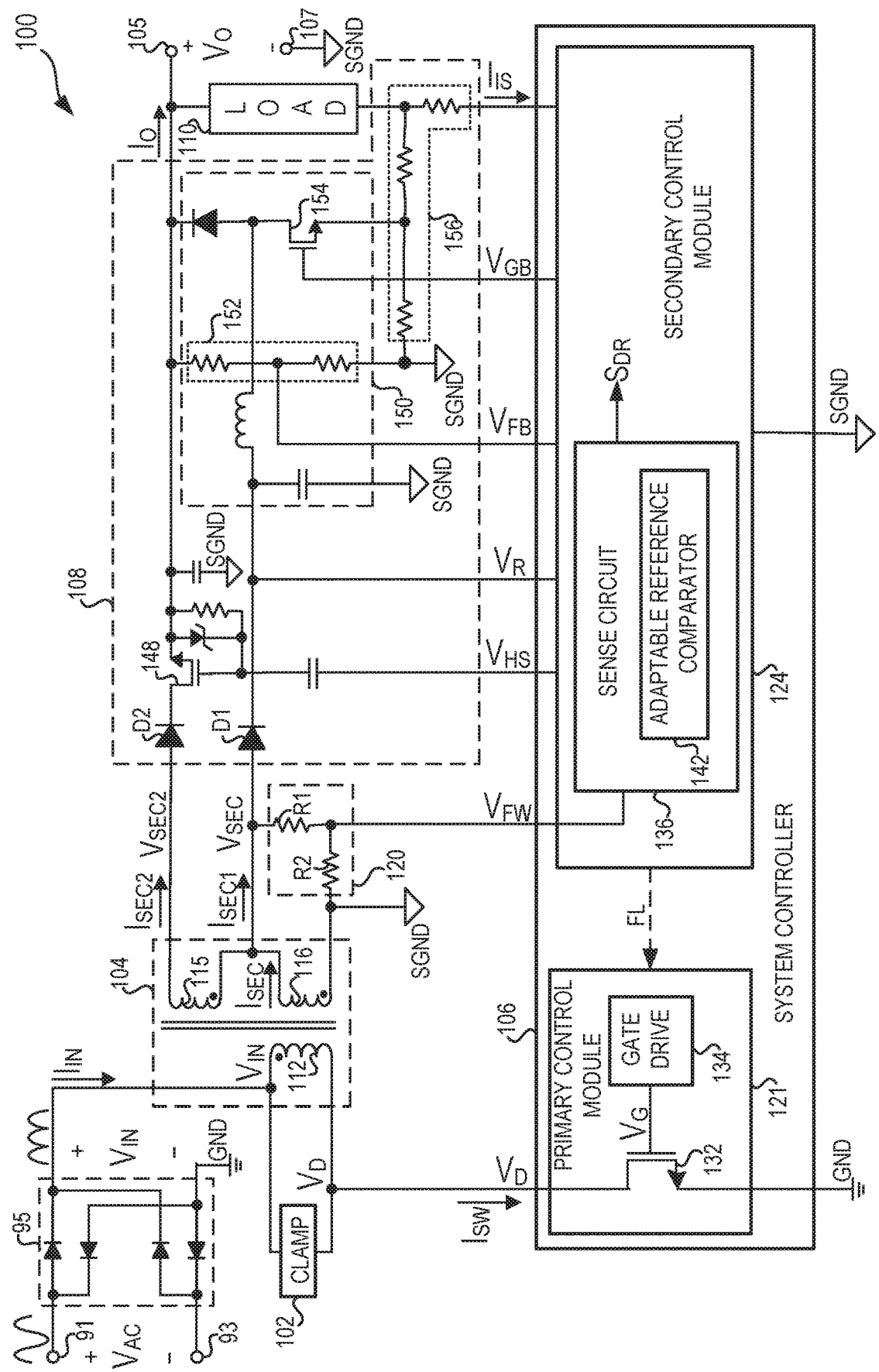
FIG. 1 illustrates a power conversion system including a sense circuit according to the teachings herein.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the teachings herein. Also, common but well-understood elements that are useful or necessary in a commercially feasible embodiment are often not depicted in order to facilitate a less obstructed view of these various embodiments for sensing a variable amplitude switching signal from a secondary winding in a power conversion system.

DETAILED DESCRIPTION

In the following description, numerous specific details are set forth in order to provide a thorough understanding for sensing a variable amplitude switching signal from a secondary winding in a power conversion system. It will be apparent, however, to one having ordinary skill in the art that the specific detail need not be employed to practice the teachings herein. In other instances, well-known materials or methods have not been described in detail in order to avoid obscuring the present disclosure.

Reference throughout this specification to "one embodiment", "an embodiment", "one example" or "an example" means that a particular feature, structure or characteristic described in connection with the embodiment or example is included in at least one embodiment for sensing a variable amplitude switching signal from a secondary winding in a power conversion system. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, when a transistor is in an "off-state" or "off" the transistor blocks current and/or does not substantially conduct current. Conversely, when a transistor is in an "on-state" or "on" the transistor is able to substantially conduct current. By way of example, in one embodiment, a high-voltage transistor comprises an N-channel metal-oxide-semiconductor (NMOS) field-effect transistor (FET) with the high-voltage being supported between the first terminal, a drain, and the second terminal, a source. In some embodiments an integrated controller circuit may be used to drive a power switch when regulating energy provided to a load. Also, for purposes of this disclosure, "ground" or "ground potential" refers to a reference voltage or potential against which all other voltages or potentials of an electronic circuit or Integrated circuit (IC) are defined or measured.

As discussed above, a power conversion system may use a switching transformer (i.e., a magnetic coupling device). The switching transformer can be used to transfer energy from a primary winding to a secondary winding during switching cycles. A primary switch may be used to connect and disconnect the primary winding in a circuit path with a primary side power source; and power may be transferred to a load which is electrically coupled to the secondary winding.

The manner in which power may be transferred and regulated is based, in part, upon the type of control. For instance, in a power conversion system (e.g., a flyback converter) control may be implemented as primary side control, also referred to as primary side regulation. During primary side control, control of the primary switch may be based on signals derived from the primary winding and/or from signals coupled from the primary winding. Alternatively, control may be implemented as secondary side control, also referred to as secondary side regulation. During secondary side control, control of the primary switch may be based on signals derived from the secondary winding and/or from signals coupled from the secondary winding. Some advantages of using secondary side regulation over primary side regulation can include improved regulation accuracy and improved transient response.

The availability and integrity of signals derived from the secondary winding can depend in part upon operating conditions. For instance, when the primary side power source provides power with a constant primary input voltage coupled to the primary winding, then signals at the secondary winding (i.e., secondary winding signals) can have waveforms with relatively consistent amplitudes. Alternatively, and additionally, when the primary side power source provides power with an input voltage which varies slowly relative to a switching cycle of the primary switch, then secondary winding signals may also have waveforms with relatively consistent amplitudes. Furthermore, when the power conversion system operates in discontinuous conduction mode, secondary signals can exhibit ringing during a period following the depletion of energy from the secondary winding. Successful detection of secondary winding signals may therefore necessitate detection circuitry which can distinguish ringing.

The availability and integrity of signals derived from the secondary winding can also depend in part upon secondary component configuration. For instance, in many secondary component configurations, secondary signals which are out of phase with respect to signals at the primary winding (i.e., primary winding signals) may be available from the secondary winding. Using out of phase secondary winding signals may advantageously simplify secondary side detection circuitry when there is ringing (e.g., during discontinuous mode). However, in newer secondary configurations, including secondary configurations with multiple outputs, using out of phase secondary winding signals may prove impractical due to component count.

A more practical multiple-output secondary with reduced component count may instead avail in-phase secondary winding signals. Thus, modern power converters with multiple outputs may use secondary component configurations which more readily avail secondary winding signals, and which are in-phase with primary winding signals. Additionally, these modern power conversion systems may operate from primary power sources which provide a variable amplitude primary input voltage. For instance, modern power conversion systems may use a primary input voltage which exhibits wide-swing amplitude variation associated with power factor correction (PFC) and/or with unfiltered rectified input power. This, in turn, can contribute to variability in the secondary winding signal amplitude; and amplitude variation can become an undesirable condition for detecting signals in the presence of ringing. Accordingly, there is a need for detection circuitry for modern power conversion systems which can successfully detect in phase secondary winding signals.

Apparatus and methods for sensing a variable amplitude switching signal from a secondary winding in a power conversion system are disclosed herein. By using a comparator with an adaptable reference, variable amplitude secondary winding signals in phase with primary winding signals may be detected in the presence of ringing. Detection of the in phase secondary winding signals, in turn, allows for secondary side control with power factor correction and discontinuous mode operation.

FIG. 1 illustrates a power conversion system 100 including a sense circuit 136 according to the teachings herein. The power conversion system 100 includes a bridge rectifier 95, a switching transformer 104, a primary winding clamp 102, a forward pin buffer 120, secondary components 108, a system controller 106, and a load 110. Alternating current (ac) input power with an ac voltage $V_{AC}$ may be delivered between input terminals 91 and 93 to the bridge rectifier 95. The bridge rectifier 95, in turn, may rectify the ac input power to provide the rectified input power (i.e., input power supply signals including input current $I_{IN}$ and input voltage $V_{IN}$) relative to a primary ground GND. Rectified input power, in turn, may be enhanced with power factor correction (PFC) and may be converted into system output power (i.e., output current $I_O$ and output voltage $V_O$) delivered to the load 110 between output terminals 105 and 107 relative to a local ground SGND.

The switching transformer 104 includes a primary winding 112 and secondary windings 115-116; and the secondary components 108 include a pass switch 148, diodes D1-D2, an auxiliary converter 150, and an overcurrent network 156. Switched power signals (i.e., primary switch current $I_{SW}$ and primary switch voltage $V_D$) at the primary winding 112 may be transferred to the secondary windings 115-116 to provide intermediate power (i.e., secondary currents $I_{SEC1}$, $I_{SEC2}$, and secondary winding signals $V_{SEC}$, $V_{SEC2}$). The secondary windings 116 and 115 may transfer intermediate power (i.e. secondary current $I_{SEC2}$ and secondary winding signal $V_{SEC2}$) rectified by diode D2 for delivery to the load 110 via pass switch 148; and the secondary winding 116 may transfer intermediate power (i.e. secondary current $I_{SEC1}$ and secondary winding signal $V_{SEC}$) rectified by diode D1 for delivery to the auxiliary converter 150.

The system controller 106 includes a primary control module 121 with a primary switch 132 and gate drive circuit 134. The gate drive circuit 134 can provide a switching gate drive signal $V_G$ to a gate of the primary switch 132 causing the primary switch 132 to provide the switched power signals (i.e., primary switch current $I_{SW}$ and primary switch voltage $V_D$) at the primary winding 112 relative to the primary ground GND. As the primary switch 132 switches between an off state and on state, the primary winding clamp 102 may clamp the primary switch voltage $V_D$ to a safe, predictable operating voltage above the input voltage $V_{IN}$.

The system controller 106 also includes a secondary control module 124 which can communicate signals relative to the local ground SGND and avail secondary control features. For instance, the secondary control module 124 may regulate signals at the secondary side. In one embodiment, the secondary control module 124 may regulate a secondary signal $V_R$ provided via diode D1 to an input of the auxiliary converter 150. Additionally, the secondary control module 124 may receive a signal $V_{FB}$ from a feedback network 152 of the auxiliary converter 150; and the secondary control module 124 may provide a control signal $V_{GB}$ to a boost switch 154 of the auxiliary converter 150 to regulate output power to the load 110. Also, by way of example, the secondary control module 124 may receive an overcurrent signal $I_{ID}$ from the overcurrent network 156 in order to provide an overcurrent circuit protection feature; and the secondary control module 124 may provide a drive signal $V_{HS}$ to drive a gate of the pass switch 148.

In availing secondary control features, the secondary control module 124 may communicate with the primary control module 121 via a coupling signal FL. The coupling signal FL can be a magnetically and/or optically coupled signal which communicates information to the primary control module 121. For instance, the coupling signal FL can be a magnetically coupled signal which indicates when to switch the primary switch 132 on or off; and the determination of when to communicate the coupling signal FL can be based, at least in part, on the detection of a secondary winding signal $V_{SEC}$.

According to the teachings herein, the secondary control module 124 includes a sense circuit 136 allowing the secondary control module 124 to sense a secondary winding signal $V_{SEC}$ and/or signals derived from the secondary winding signal $V_{SEC}$. As shown in FIG. 1, the forward pin buffer 120 may provide a secondary signal $V_{FW}$ to the sense circuit 136 in relation to the secondary winding signal $V_{SEC}$ based on a resistor R1 and a resistor R2. For instance, the resistors R1 and R2 of the forward pin buffer 120 may attenuate (i.e., divide) the secondary winding signal $V_{SEC}$ to provide the secondary signal $V_{FW}$. Alternatively, in some embodiments the forward pin buffer 120 may provide the secondary winding signal $V_{SEC}$ un-attenuated to the sense circuit 136.

Also according to the teachings herein, the sense circuit 136 may include an adaptable reference comparator 142 to detect transitions of the secondary winding signal $V_{SEC}$ in phase with transitions of the primary switch 132. The adaptable reference comparator 142 may allow the sense circuit 136 to distinguish a transition of the secondary signal $V_{FW}$ whereby the transition is indicative of a switching transition of the primary switch 132. Additionally, the sense circuit 136 may provide an output signal $S_{DR}$ in response to detecting a transition of the primary switch 132 from a transition of the secondary winding signal $V_{SEC}$. The output signal $S_{DR}$ may, in turn, be used by the secondary control module 124 to determine when to communicate a coupling signal FL to the primary control module 121. For instance, the secondary control module 124 may communicate a coupling signal FL to the primary control module 121 based on the output signal $S_{DR}$ indicating an on/off transition of the primary switch 132.

FIG. 2A illustrates waveforms 201-202 of a secondary winding signal $V_{SEC}$ and a secondary signal $V_{FW}$ according to an embodiment. Waveforms 201-202 are plotted in volts versus time to illustrate periodic switching transitions. Switching transitions and switching cycles may correspond with switching transitions and switching cycles of the primary switch 132 of FIG. 1. For instance, times ta1, tb1, tc1, and td1, where waveforms 201-202 transition high, may indicate when the primary switch 132 turns off; and times ta3, tb3, and tc3, where waveforms 201-202 transition low, may indicate when the primary switch 132 turns on. Additionally, times ta2, tb2, and tc2 may indicate an onset of discontinuous mode, whereby the secondary winding signal $V_{SEC}$ and secondary signal $V_{FW}$ exhibit ringing.

Switching cycles can depend upon an operating frequency of primary switch 132. For instance, with reference to FIG. 1, waveforms 201-202 may have cycles based on a switching drive signal $V_G$ which may have a frequency (e.g., one hundred kilohertz) with a duty cycle (e.g., twenty percent). In this way cycles may be defined to start at times ta1, tb1, tc1, and td1.

Cycles may be further characterized as having a flat-top interval, a flat-bottom interval, and a ringing interval. For instance, as shown in FIG. 2A, waveforms 201-202 exhibit a flat-top interval from time ta1 to time ta2, time tb1 to time tb2, and time tc1 to time tc2. During the flat-top intervals (i.e., from time ta1 to time ta2, time tb1 to time tb2, and time tc1 to time tc2), waveforms 201-202 may remain relatively flat (i.e., constant) due, at least in part, to time scale.

Also, waveforms 201-202 exhibit a flat-bottom interval from time ta3 to time tb1, time tb3 to time tc1, and time tc3 to time td1. During the flat-bottom intervals, waveform 201 may also remain relatively flat (i.e., constant) due, at least in part, to time scale; and as will be further discussed herein, waveform 202 may remain flat during the flat-bottom intervals by virtue of clamping. Additionally, waveforms 201-202 may also exhibit a ringing interval from time ta2 to time ta3, time tb2 to time tb3, and time tc2 to time tc3.

By way of example, a cycle may have a period between ten and one-hundred microseconds, a flat-top interval between four and forty microseconds, a flat-bottom interval between two and twenty microseconds, and a ringing interval between four and forty microseconds. However, as one of ordinary skill in the art can appreciate, values of a cycle period, flat-top interval, flat-bottom interval, and ringing interval can vary and may depend, at least in part, on system configuration (e.g., power conversion system 100 configuration).

Also, as illustrated by waveforms 201-202, the secondary signal $V_{FW}$ and the secondary winding signal $V_{SEC}$ may have different amplitudes dependent upon a configuration of the power conversion system 100. For instance, waveform 201 may correspond with steady state conditions whereby the secondary signal $V_R$ as shown in FIG. 1 is regulated. In this way during the flat-top intervals between time ta1 to time ta2, time tb1 to time tb2, and time tc1 to time tc2, diode D1 may conduct to hold the secondary winding signal $V_{SEC}$ at or substantially equal to a secondary flat top voltage $V_{ST}$. The secondary flat-top voltage $V_{ST}$ may be approximately and/or substantially equal to a voltage of secondary signal $V_R$ plus a voltage drop across diode D1.

Additionally, as illustrated by waveform 202, the secondary signal $V_{FW}$ may be provided from the forward pin buffer 120 to have a substantially constant forward flat-top voltage $V_{FT}$ during the flat-top intervals from time ta1 to time ta2, time tb1 to time tb2, and time tc1 to time tc2. When a driving point impedance of the sense circuit 136 is relatively high compared to a Thevenin impedance of the forward pin buffer 120, then the forward flat-top voltage $V_{FT}$ may be a scaled replica of secondary flat-top voltage $V_{ST}$.

Also as illustrated by waveform 201, the secondary winding signal $V_{SEC}$ reaches a secondary flat-bottom voltage $V_{SB}$ during the flat-bottom intervals from time ta3 to time tb1, time tb3 to time tc1, and time tc3 to time td1. The secondary flat-bottom voltage $V_{SB}$ can relate to the input voltage $V_{IN}$ by a transformer winding ratio. For instance, during the flat-bottom intervals, the primary switch 132 may be operating in the on-state to cause the input voltage $V_{IN}$ to be across the primary winding 112. In this way, the secondary winding signal $V_{SEC}$ will have a voltage proportional to the input voltage $V_{IN}$ by a windings ratio between the primary winding 112 and the secondary winding 116. Thus, the secondary flat-bottom voltage $V_{SB}$ can be proportional, by a transformer windings ratio, with the input voltage $V_{IN}$.

Additionally, as illustrated by waveform 202, the secondary signal $V_{FW}$ may be provided from the forward pin buffer 120 to have a substantially constant forward flat-bottom voltage $V_{CL}$ during the flat-bottom intervals (e.g., the flat bottom intervals from time ta3 to time tb1, time tb3 to time tc1, and time tc3 to time td1). According to the teachings herein, the sense circuit 136 may have a driving point impedance which functionally shorts (i.e., clamps) the secondary signal $V_{FW}$ when the secondary winding signal $V_{SEC}$ reduces below the forward flat-bottom voltage $V_{CL}$. For instance, the forward flat-bottom voltage $V_{CL}$ can be the local ground SGND (i.e., zero volts) whereby the sense circuit 136 clamps the secondary signal $V_{FW}$ to zero and/or substantially zero volts.

Clamping the secondary signal $V_{FW}$ to local ground SGND may advantageously provide information for a value Vpk of the secondary signal $V_{SEC}$. For instance, with reference to FIG. 1, a relationship may be derived for a current $I_{R1}$ sourced from the sense circuit 136:

$$Vpk = R_1 \times I_{R1} \quad \text{EQ. 1}$$

In Equation 1, resistance $R_1$ can be a resistance of resistor R1; and current $I_{R1}$ can be a value of current in resistor R1.

Furthermore, during a flat-bottom interval (e.g., any one of the flat bottom intervals from time ta3 to time tb1, time tb3 to time tc1, and time tc3 to time td1), the value Vpk of the secondary signal $V_{SEC}$ may be related to (i.e., substantially proportional to) the input voltage $V_{IN}$; and Equation 1 may be recast as follows:

$$V_{IN} = N \times R_1 \times I_{R1} \quad \text{EQ. 2}$$

With reference to FIG. 1, Equation 2 may provide a relationship and/or estimate of the input voltage $V_{IN}$ during a flat-bottom interval where N is a turns ratio of the primary winding 112 to the secondary winding 116.

According to the teachings herein, the sense circuit 136 may include circuits based, at least in part, upon the relationships of Equation 1 and/or Equation 2 to distinguish a flat-bottom interval.

As illustrated by waveforms 201-202, the secondary winding signal $V_{SEC}$ and the secondary signal $V_{FW}$ exhibit ringing during the ringing intervals from time ta2 to time ta3, time tb2 to time tb3, and time tc2 to time tc3. For instance, ringing may begin at or around time ta2 due to the onset of discontinuous mode.

Also, as illustrated by waveform 201, ringing may be constrained to be sinusoidal or approximately sinusoidal with amplitude peaks occurring between the secondary flat-top voltage $V_{ST}$ and a lower secondary ringing voltage $V_{SR}$. Ringing peaks may be symmetrical and/or approximately symmetrical with respect to local ground SGND (i.e., with respect to zero volts). For instance, in some embodiments the magnitude of the lower secondary ringing voltage $V_{SR}$ may be substantially equal to the secondary flat-top voltage $V_{ST}$.

Additionally, as illustrated by waveform 202, during the ringing intervals (i.e., the ringing intervals from time ta2 to time ta3, time tb2 to time tb3, and time tc2 to time tc3) the secondary signal $V_{FW}$ may be clamped when the secondary winding signal $V_{SEC}$ rings below zero voltage. For instance, between time tr1 and time tr2 the secondary signal $V_{FW}$ may be clamped to the forward flat-bottom voltage $V_{CL}$ (i.e., zero volts). According to the teachings herein, the sense circuit 136 may comprise circuits to further distinguish clamping during a flat-bottom interval (e.g., a flat-bottom interval from time tc3 to time td1) from clamping during a ringing interval (e.g., between time tr1 and time tr2).

Waveforms 201-202 illustrate the secondary winding signal $V_{SEC}$ and the secondary signal $V_{FW}$ under regulated conditions whereby the secondary winding signal $V_{SEC}$ transitions to the same, or substantially the same, secondary flat-top voltage $V_{ST}$; however, other operating conditions are possible. For instance, the secondary signal $V_R$ may become unregulated and give rise to a secondary signal $V_{FW}$ as shown in FIG. 2B.

Figure 2B:
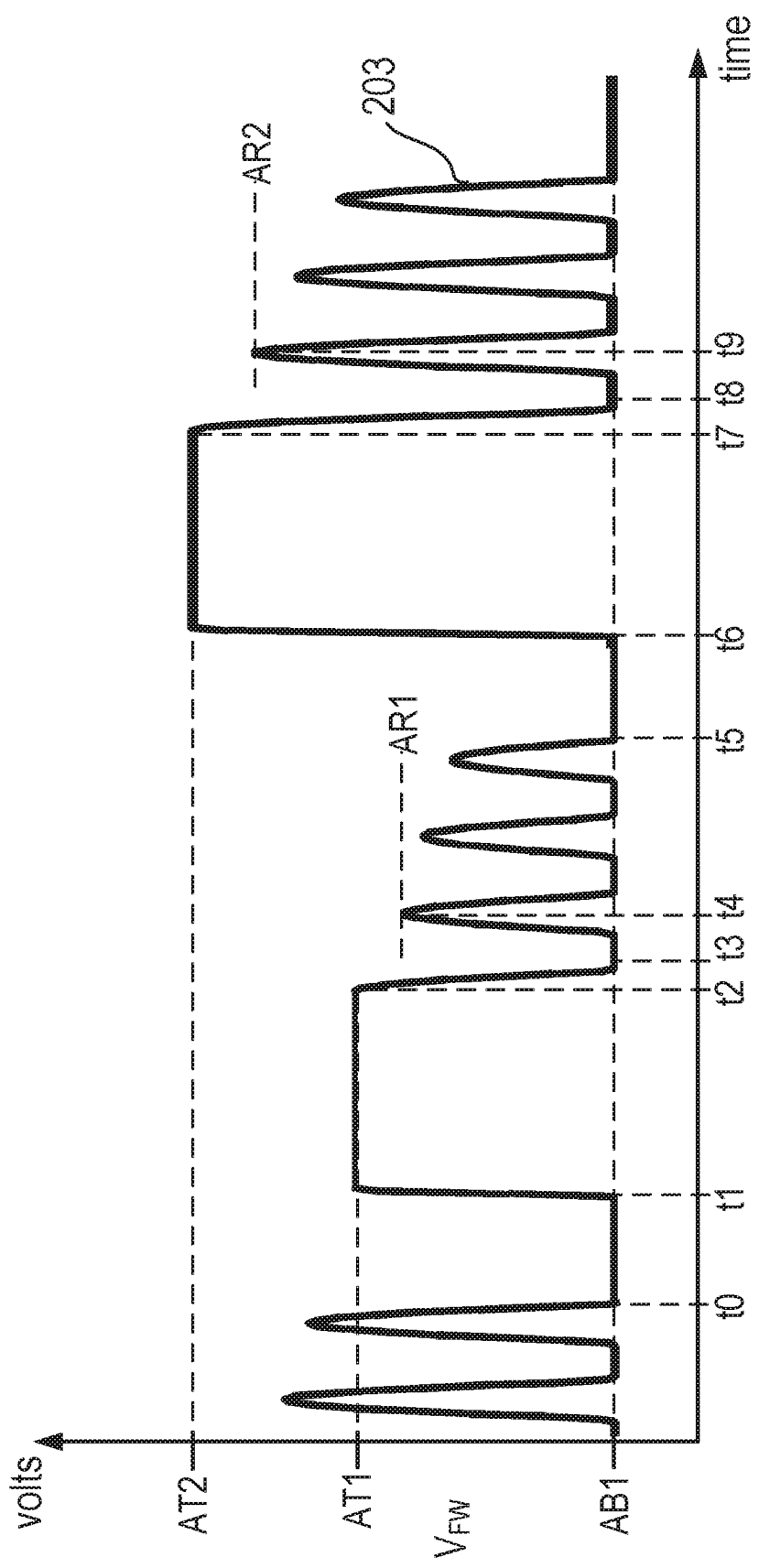
FIG. 2B illustrates a waveform corresponding to a secondary winding signal according to an embodiment.

FIG. 2B illustrates a waveform 203 corresponding to a secondary signal $V_{FW}$ according to another embodiment. With reference to FIG. 1, waveform 203 may illustrate the secondary signal $V_{FW}$ during switching cycles of the primary switch 132 when the secondary signal $V_R$ is unregulated. When the secondary signal $V_R$ is unregulated, secondary flat-top voltages may be determined, at least in part, by the lesser of the secondary signal $V_R$ and the output voltage $V_O$.

At time t1 and time t6 the primary switch 132 may transition from an on state to an off state. In response to the primary switch voltage $V_D$ transitioning (i.e., rising) above the input voltage $V_{IN}$, the secondary winding signal $V_{SEC}$, and hence the secondary signal $V_{FW}$ (i.e., waveform 203), may transition high, in phase with primary switch voltage $V_D$. However, unlike waveform 202, waveform 203 has variable (i.e., unequal) forward flat-top voltages. From a perspective of switching transitions and signal amplitudes, waveform 203 transitions from an amplitude AB1 to an amplitude AT1 (i.e., a first flat-top voltage) at time t1 and from amplitude AB1 to an amplitude AT2 (i.e., a second flat-top voltage) at time t6. Also as illustrated, amplitude AT1 can be different (i.e., less) than amplitude AT2 when the secondary signal $V_R$ is unregulated.

Like waveform 202, waveform 203 exhibits flat-top intervals after the primary switch 132 transitions to the off state. For instance, waveform 203 has a flat-top interval from time t1 to time t2 and time t6 to time t7. Also, like waveform 202, waveform 203 exhibits ringing intervals. For instance, waveform 203 has a ringing interval between time t2 and time t5; and also as illustrated, a ringing interval may begin at time t7. As discussed above, a ringing interval may begin when energy in secondary winding 116 depletes due to the onset of discontinuous mode (i.e., when secondary current $I_{SEC}$ reduces to substantially zero).

The onset of discontinuous mode may also cause an edge between times t2 and t3 and between times t7 and t8. For instance, between times t2 and t3 waveform 203 transitions from amplitude AT1 towards amplitude AB1 (i.e., falls towards amplitude AB1) to exhibit an edge (i.e., a falling edge); and between times t7 and t8 waveform 203 transitions from amplitude AT2 towards amplitude AB1 to exhibit an edge.

Also, following the edges (i.e., the falling edges), ringing may occur due to reactive impedance at the primary switch 132. As illustrated, at time t4 waveform 203 exhibits a transition (i.e., an oscillatory transition) to amplitude AR1, which can be less than amplitude AT1. Similarly, at time t9 waveform 203 exhibits a transition (i.e., an oscillatory transition) to amplitude AR2, which can be less than amplitude AT2.

Additionally, ringing (i.e., oscillatory transitions) may continue until the primary switch 132 transitions from the off state to the on state. For instance, at times t0 and t5 when the primary switch 132 transitions from the off state to the on state, the waveform 203 transitions to amplitude AB1. Also, like waveform 202, waveform 203 exhibits flat-bottom intervals. For instance, waveform 203 exhibits a flat bottom interval from time t0 to time t1 and time t5 to time t6; and as described above they (i.e., the flat bottom intervals) may be indicative of an on state condition of the primary switch 132. Also, as described above, in some embodiments the amplitude AB1 may be set by a clamped voltage (e.g., may be zero volts).

As discussed above, a complete switching cycle may include a period of time during which the primary switch 132 operates and transitions between both the off state and the on state. For instance, a cycle period may be delineated from time t1 to time t6 where t1 begins a first cycle and t6 begins a second cycle. According to the teachings herein, the sense circuit 136 can include an adaptable reference comparator 142 which can adapt to the variability of waveform 203 on a cycle by cycle basis.

Figure 3A:
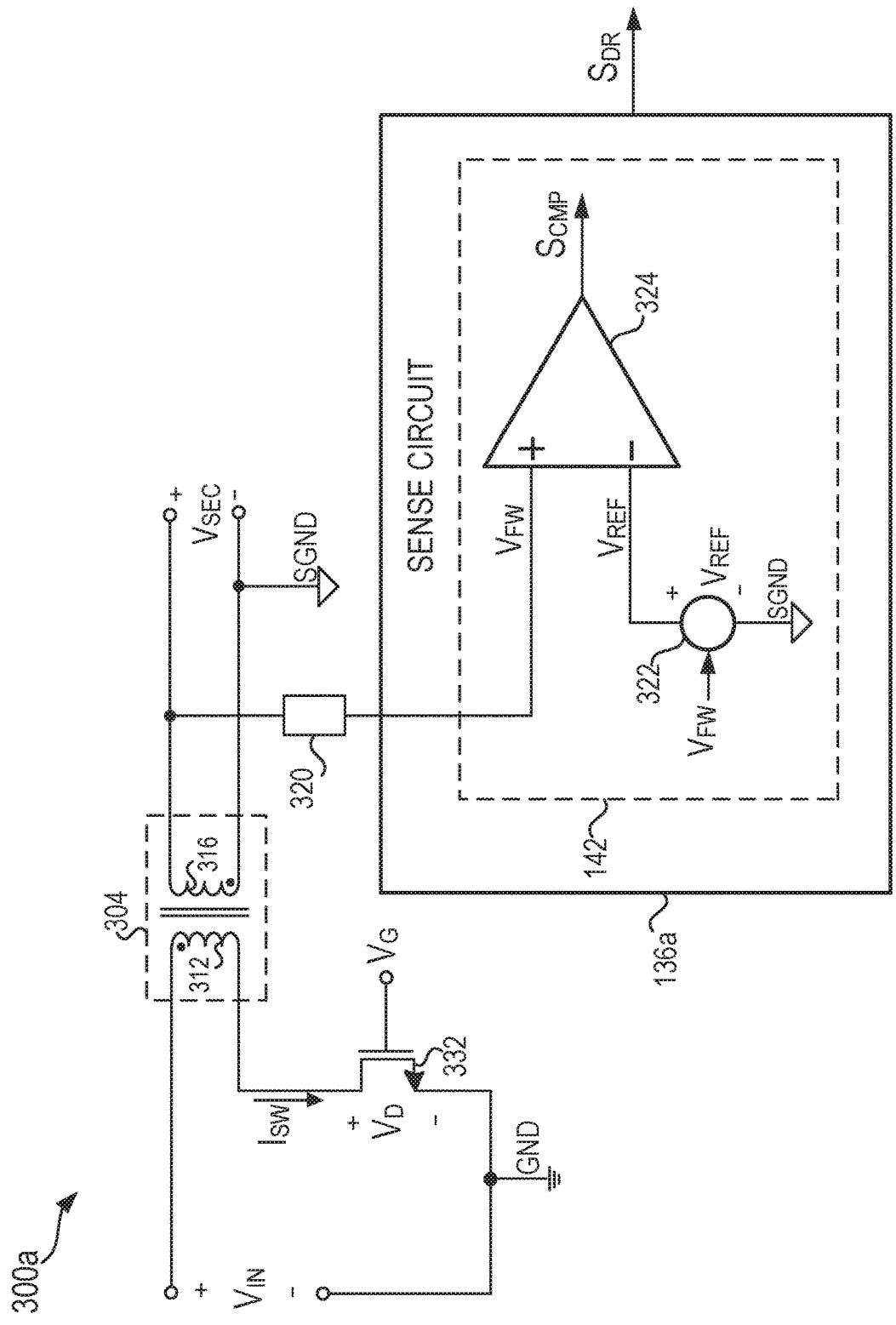
FIG. 3A illustrates a system using a sense circuit according to a first embodiment.

FIG. 3A illustrates a system 300a using a sense circuit 136a according to a first embodiment. Similar to power conversion system 100, the system 300a includes a primary switch 332, a switching transformer 304, a forward pin buffer 320, and a sense circuit 136a; whereby the primary switch 332, switching transformer 304, forward pin buffer 320, and sense circuit 136a may have circuit functions and operate similar to primary switch 132, switching transformer 104, forward pin buffer 120, and sense circuit 136. Like those of the power conversion system 100, switched power signals (i.e., primary switch current $I_{SW}$ and primary switch voltage $V_D$) at the primary winding 312 may be transferred to the secondary winding 316 providing a secondary winding signal $V_{SEC}$; and the forward pin buffer 320, like forward pin buffer 120, may provide the secondary signal $V_{FW}$.

Sense circuit 136a includes an adaptable reference comparator 142; and the adaptable reference comparator 142 includes a comparator 324 and an adaptable reference generator 322. Comparator 324 may receive the reference $V_{REF}$, from the adaptable reference generator 322, at its inverting input and the secondary signal $V_{FW}$ at its non-inverting input; in response to a comparison of the reference $V_{REF}$ and the secondary signal $V_{FW}$, the comparator 324 may provide signal $S_{CMP}$. The sense circuit may, in turn, provide output signal $S_{DR}$, based on signal $S_{CMP}$.

Also as illustrated, the adaptable reference generator 322 may receive the secondary signal $V_{FW}$ to adapt the reference $V_{REF}$ based on cycles of a waveform (e.g., waveform 201) corresponding to secondary winding signal $V_{SEC}$. The adaptable reference generator 322 may also adapt the reference $V_{REF}$ to be cycle dependent (i.e., cycle dependent) such that the comparator 324 changes state in response the primary switch 332 turning off each cycle. Accordingly, signal $S_{CMP}$ may change in response to the secondary signal $V_{FW}$ transitioning at times t1 and t6.

With reference to waveform 203, the adaptable reference generator 322 may, during the cycle prior to time t1, adjust the value of reference $V_{REF}$ so that it may be less than amplitude AT1. In this way at time t1 the comparator 324 may change state (i.e., signal $S_{CMP}$ may transition from low to high) in response to the waveform 203 rising to amplitude AT1. Then during the cycle beginning at time t1, the adaptable reference generator 322 may adapt the reference $V_{REF}$ in relation to the amplitude AT1 so the comparator 324 returns to its state prior to the transition at t1 without further transition.

Following time t1 and prior to the subsequent cycle (i.e., prior to time t6), the reference $V_{REF}$ may be adjusted to a value (e.g. to a value greater than amplitude AT1) whereby the comparator 324 does not change state (i.e., the comparator holds state so that signal $S_{CMP}$ remains substantially constant) in response to ringing. For instance, the reference $V_{REF}$ may be adjusted so that comparator 324 maintains signal $S_{CMP}$ at logic low when the waveform 203 rises to amplitude AR1 at time t4.

Similarly, prior to a subsequent cycle beginning at time t6, the adaptable reference generator 322 may adjust the reference $V_{REF}$ to be less than the amplitude AT2 so that at time t6 the comparator 324 changes state and signal $S_{CMP}$ changes (i.e., transitions) in response to the waveform 203 rising to amplitude AT2. Then during the cycle beginning at time t6, the adaptable reference generator 322 may adapt the reference $V_{REF}$ in relation to the amplitude AT2 so that comparator 324 returns to its low state (i.e., signal $S_{CMP}$ returns low) without further transition. For instance, the reference $V_{REF}$ may be adjusted so that comparator 324 maintains signal $S_{CMP}$ at logic low when the waveform 203 rises to amplitude AR2 at time t9.

In response to the comparator 324 changing state with a corresponding transition of signal $S_{CMP}$, the sense circuit 136a may provide the output signal $S_{DR}$ to a secondary control module (e.g., secondary control module 124). In this way the output signal $S_{DR}$ may advantageously inform the secondary control module of an operating state (i.e., on state and/or off state) of primary switch 332. The secondary control module may, in turn, provide the coupling signal FL to a primary control module (e.g., primary control module 121) based on the information provided by the output signal $S_{DR}$. For instance, the coupling signal FL may indicate the transitions at times t1 and t6. Although FIG. 3A shows a sense circuit 136a providing an output signal $S_{DR}$ using an adaptable reference comparator 142 with one comparator 324, other embodiments having greater or fewer components and more than one output signal $S_{DR}$ are also possible.

Figure 3B:
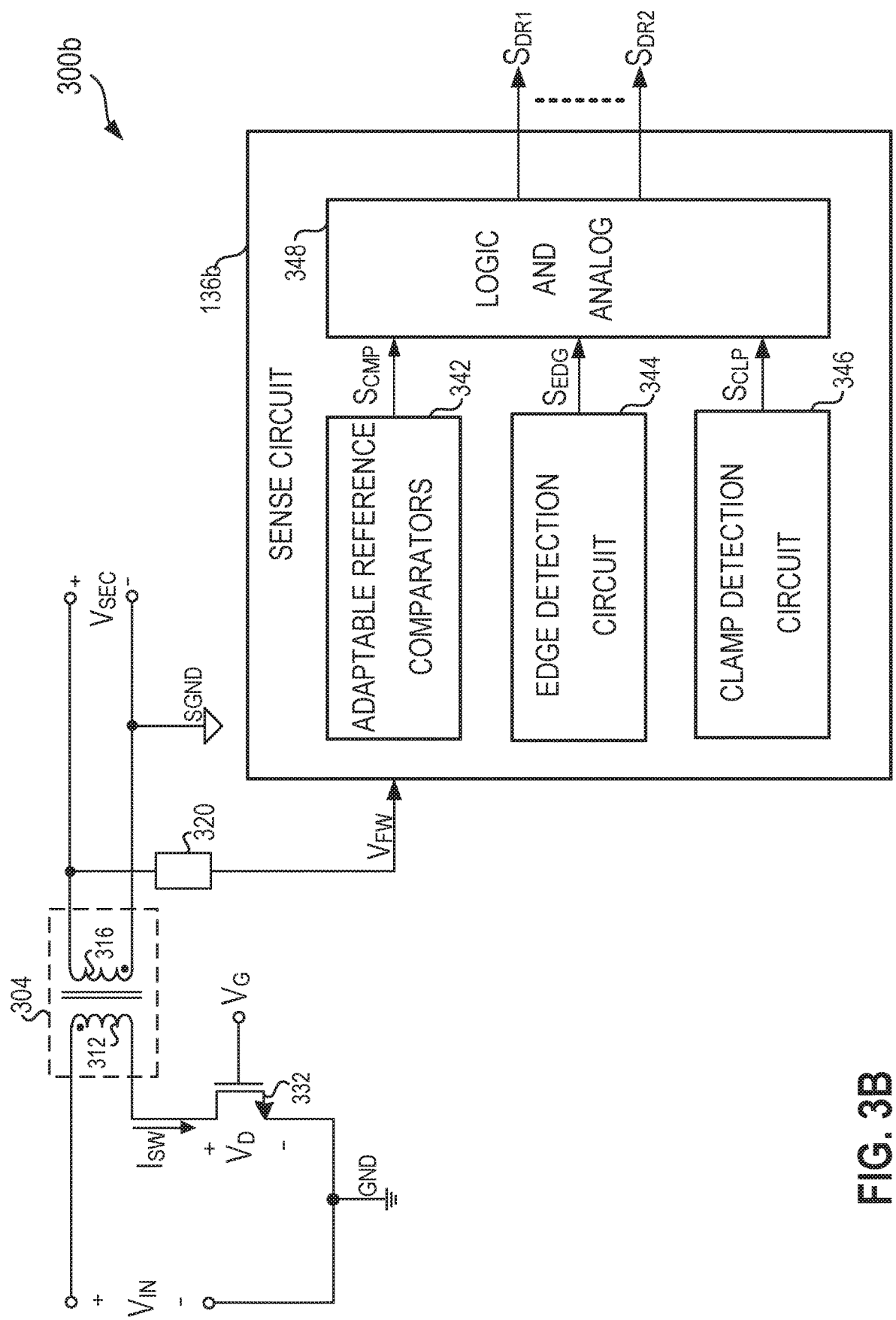
FIG. 3B illustrates a system using a sense circuit according to a second embodiment.

FIG. 3B illustrates a system 300b using a sense circuit 136b according to a second embodiment. The second embodiment of system 300b is similar to the first embodiment of system 300a, except system 300b uses a sense circuit 136b. Like sense circuit 136a, sense circuit 136b may receive secondary signal $V_{FW}$; however, sense circuit 136b may include additional functionality for sensing aspects of waveform 203 corresponding to secondary signal $V_{FW}$. Additionally, sense circuit 136b may provide output signals $S_{DR1}$-$S_{DR2}$ to indicate a condition of system 300b and/or a switching state of primary switch 332.

Sense circuit 136b includes adaptable reference comparators 342, an edge detection circuit 344, a clamp detection circuit 346, and a logic and analog circuit block 348. The adaptable reference comparators 342, edge detection circuit 344, and clamp detection circuit 346 may respectively provide signals $S_{CMP}$, $S_{EDG}$, and $S_{CLP}$ to the logic and analog circuit block 348. The logic and analog circuit block 348 may, in turn, provide output signals SDR1-SDR2 in response to signals $S_{CMP}$, $S_{EDG}$, and $S_{CLP}$.

Adaptable reference comparators 342 can include at least one adaptable reference comparator (e.g., adaptable reference comparator 142); and like adaptable reference comparator 142, adaptable reference comparators 342 may provide the signal $S_{CMP}$. The signal $S_{CMP}$ may be indicative of the switching state of primary switch 332 (i.e., indicative of the primary switch 332 transition from on to off). For instance, adaptable reference comparators 342 may change state thereby causing the signal $S_{CMP}$ to change state (e.g., transition from low to high) at times t1 and t6.

Similarly, edge detection circuit 344 may provide the signal $S_{EDG}$ indicative of the transfer of energy in the secondary winding 316. For instance, the edge detection circuit 344 may change state due to an edge relating to discontinuous mode (e.g., an edge between times t2 to t3 and/or times t7 to t8). In response, the edge detection circuit 344 may cause the signal $S_{EDG}$ to transition.

Additionally, clamp detection circuit 346 may provide a signal $S_{CLP}$ indicative of an operating state. For instance, the clamp detection circuit 346 may change state when waveform 203 transitions to amplitude AB1 during a flat-bottom interval (e.g., from time t0 to time t1). In this way clamp detection circuit 346 may provide the signal $S_{CLP}$ to indicate when the primary switch 332 operates in the on state.

Figure 3C:
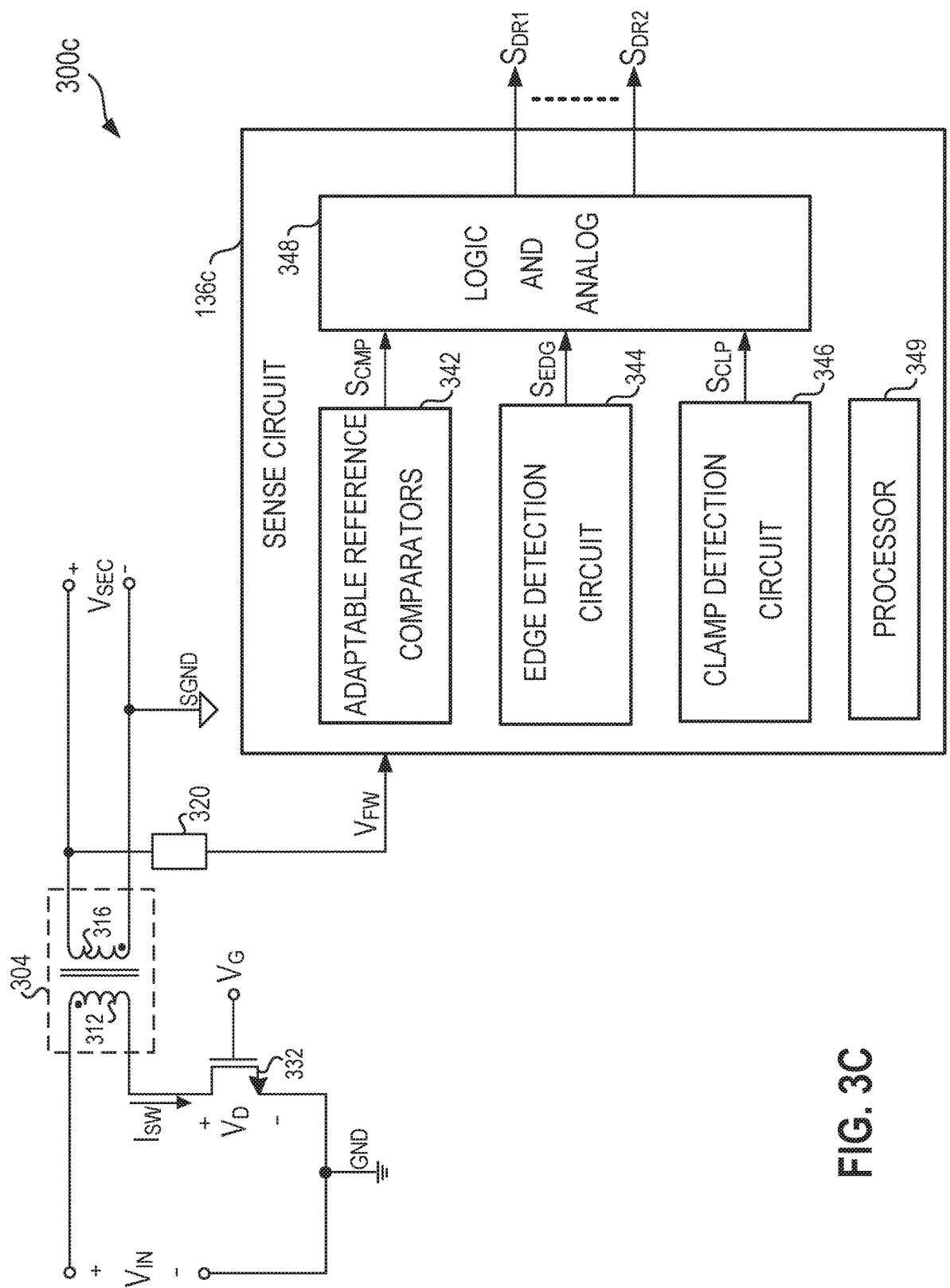
FIG. 3C illustrates a system using a sense circuit according to a third embodiment.

FIG. 3C illustrates a system 300c using a sense circuit 136c according to a third embodiment. Sense circuit 136c can be similar to sense circuit 136b except it includes a processor 349. The processor may augment sense circuit 136c by controlling and/or processing digital and analog signals of the adaptable reference comparators 342, the edge detection circuit 344, the clamp detection circuit 346, and the logic and analog circuit block 348.

Figure 4A:
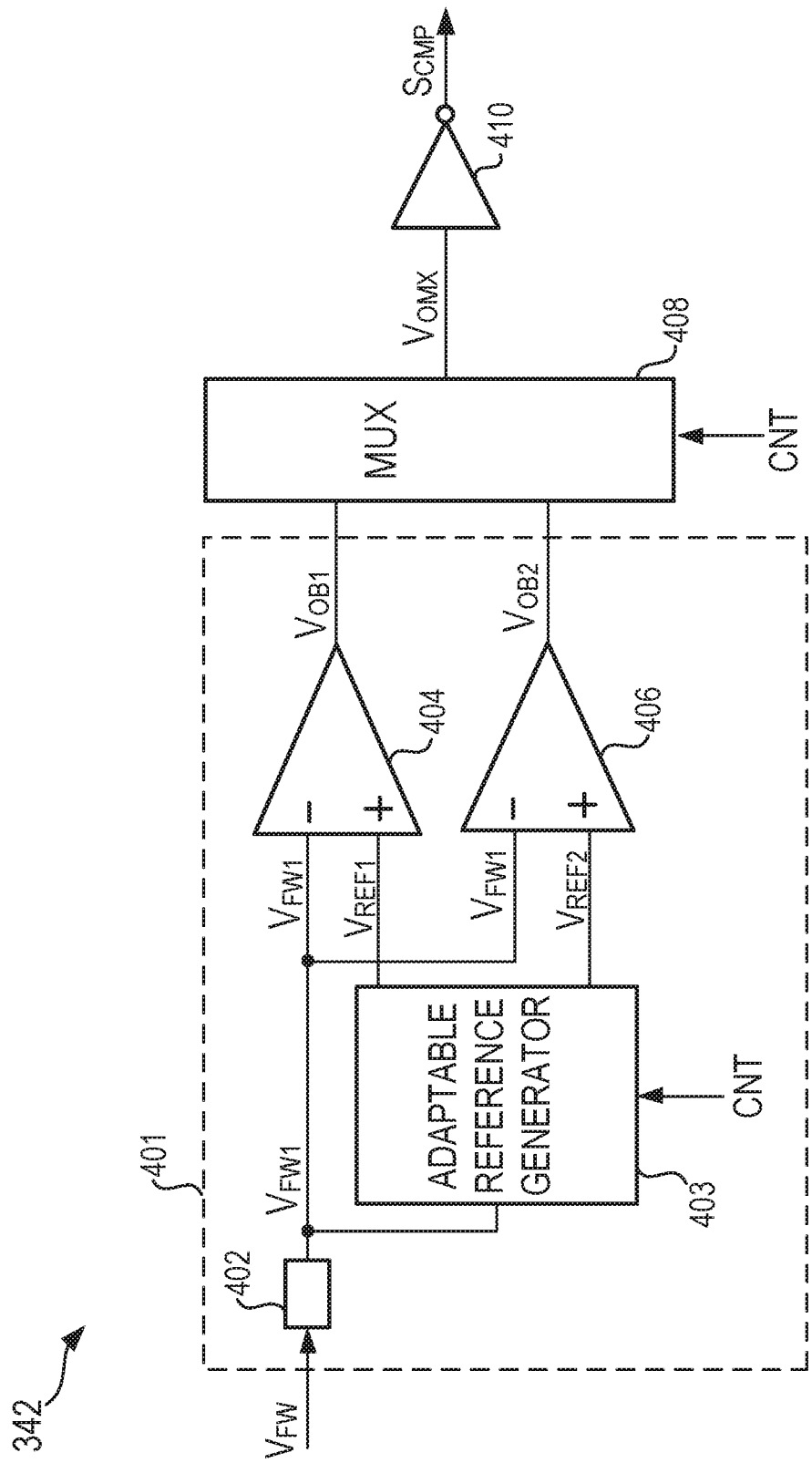
FIG. 4A illustrates adaptable reference comparators from a sense circuit according to an embodiment.

FIG. 4A illustrates adaptable reference comparators 342 from sense circuit 136b according to an embodiment. The adaptable reference comparators 342 include a comparators block 401, a multiplexer 408, and an inverter 410. The comparators block 401 receives the secondary signal $V_{FW}$ and provides output signals $V_{OB1}$, $V_{OB2}$ to the multiplexer 408. In response to a control signal CNT, multiplexer 408 selects one of output signals $V_{OB1}$, $V_{OB2}$ to provide multiplexed output $V_{OMX}$. Inverter 410 then provides signal $S_{CMP}$ as the logical inverse of the multiplexed output $V_{OMX}$.

As illustrated the comparators block 401 includes an interface circuit 402, an adaptable reference generator 403, a comparator 404, and a comparator 406. The interface circuit 402 may level shift and/or buffer the secondary signal $V_{FW}$ and then provide signal $V_{FW1}$ to the adaptable reference generator 403 and to the inverting inputs of comparators 404, 406. The adaptable reference generator 403 may provide references $V_{REF1}$ and $V_{REF2}$ to the non-inverting input of comparator 404 and the non-inverting input of comparator 406, respectively.

Additionally, the adaptable reference generator 403 may, in response to the control signal CNT, adapt references $V_{REF1}$ and $V_{REF2}$ according to cycles of the primary switch 332. For instance, on odd switching cycles, the references $V_{REF1}$ and $V_{REF2}$ may be provided so that output signal $V_{OB1}$ indicates when the primary switch 332 transitions from on to off (e.g., at time t1); and on even switching cycles the references $V_{REF1}$ and $V_{REF2}$ may be provided so that output signal $V_{OB2}$ indicates when the primary switch 332 transitions from on to off (e.g., at time t6). The control signal CNT may then control the multiplexer 408 to provide multiplexed output $V_{OMX}$ based on the cycle (i.e., even or odd cycle).

Figure 4B:
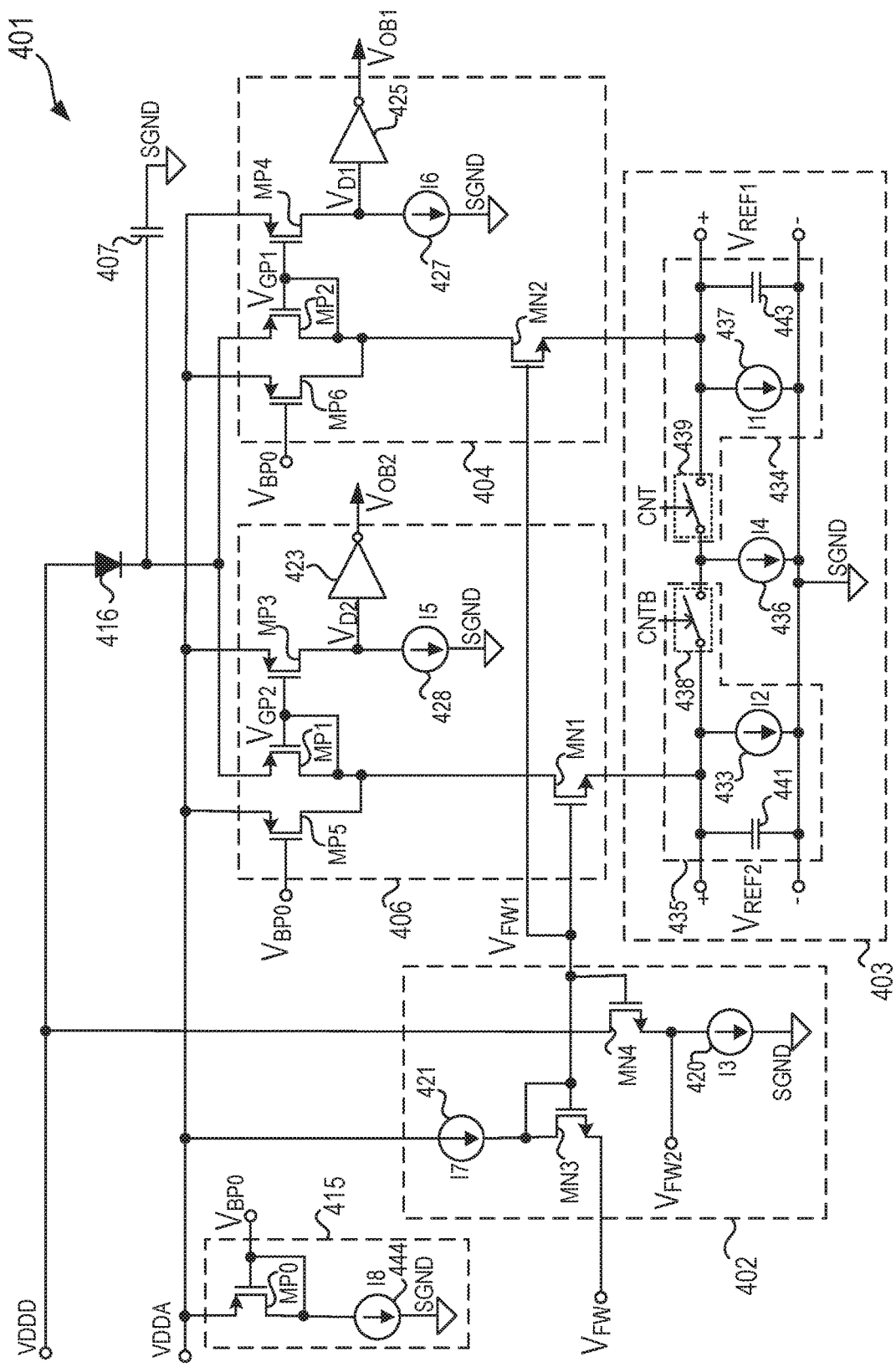
FIG. 4B illustrates a circuit realization of a comparators block according to an embodiment.

FIG. 4B illustrates a circuit realization of the comparators block 401 according to an embodiment. The comparators block 401 includes the interface circuit 402, adaptable reference generator 403, comparator 404, comparator 406, a filter capacitor 407, a bias network 415, and a diode 416. The circuit realization shows a digital supply rail VDDD and an analog supply rail VDDA which may be constructed by physical layout. In a physical layout the digital supply rail VDDD may supply voltage (e.g., a potential VDDD between one and ten volts) to on chip components having more noise and or switching, while the analog supply rail VDDA may supply voltage (e.g., a potential VDDA between one and ten volts) to analog components such as current mirrors and bias networks. As one of ordinary skill in the art may appreciate, other configurations having greater or fewer supply rails are also possible. For instance, in one embodiment the comparators block 401 may use just one supply rail (e.g., a single supply rail VDD).

The bias network 415 includes a PMOS transistor MP0 and a current source 444. PMOS transistor MP0 is diode connected having its source electrically coupled to the analog supply rail VDDA and its gate and drain electrically coupled together with the current source 444. The current source 444 may sink a current I8 from the drain of PMOS transistor MP0 to establish a PMOS bias potential $V_{BP0}$ at the gate of PMOS transistor MP0.

The interface circuit 402 includes current sources 420-421 and NMOS transistors MN3-MN4. As illustrated, NMOS transistor MN3 is diode connected with its drain and gate electrically coupled together with the current source 421. Current source 421 sources a current I7 to the drain of NMOS transistor MN3 to level shift the secondary signal $V_{FW}$ from its source to the signal $V_{FW1}$ at its gate. The gates of NMOS transistors MN3 and MN4 are then electrically coupled so that NMOS transistor MN4 may operate as a source follower in combination with current source 420. Current source 420 sources a current I3 from the source of NMOS transistor MN4 so that a buffered signal $V_{FW2}$ may follow signal $V_{FW1}$; and in some embodiments, the buffered signal $V_{FW2}$ may have a voltage substantially equal to that of secondary signal $V_{FW}$ and may be used to drive low impedance inputs.

Comparator 404 includes PMOS transistors MP2, MP4, MP6, NMOS transistor MN2, current source 427, and inverter 425. As illustrated, the gates of PMOS transistors MP2 and MP4 are electrically coupled together with the drains of PMOS transistors MP2 and MP6 and with the drain of NMOS transistor MN2. The gate of PMOS transistor MP6 may receive the PMOS bias potential $V_{BP0}$ so that PMOS transistor MP6 sources a drain current to the drain of NMOS transistor MN2. Also, current source 427 is electrically coupled to the drain of PMOS transistor MP4 to sink a current I6; and the drain of PMOS transistor MP4 is also electrically coupled to the input of inverter 425 where it provides a drain signal $V_{D1}$.

With comparison to FIG. 4A, the inverting and non-inverting inputs of comparator 404 may correspond respectively with the gate and source of NMOS transistor MN2; and the output of comparator 404 may correspond with the output of inverter 425. By comparison, the gate of NMOS transistor MN1 is electrically coupled to the gate of NMOS transistor MN2 to receive the signal $V_{FW1}$; and the source of NMOS transistor MN2 receives the reference $V_{REF1}$. Also, as one of ordinary skill in the art may appreciate, a threshold voltage of NMOS transistor MN2 may be analogous with an offset voltage of comparator 404.

Thus, when the signal $V_{FW1}$ exceeds the reference $V_{REF1}$ plus an offset voltage (i.e., a threshold voltage of NMOS transistor MN2), then the output of inverter 425 (i.e., output signal $V_{OB1}$) may accordingly change state. For instance, as the signal $V_{FW1}$ exceeds the reference $V_{REF1}$ (i.e., exceeds the reference $V_{REF1}$ plus a threshold voltage of NMOS transistor MN2), the drain current in NMOS transistor MN2 may increase, thereby causing gate potential $V_{Gp1}$ to decrease. As the gate potential $V_{GP1}$ decreases, the drain current of PMOS transistor MP4 may increase until the drain signal $V_{D1}$ at the input of inverter 425 exceeds a logic threshold. When the drain signal $V_{D1}$ exceeds the logic threshold of inverter 425, the output signal $V_{OB1}$ may transition from high to low.

As illustrated, comparator 406 may have a configuration with components electrically connected similar to that of comparator 404. For instance, comparator 406 includes PMOS transistors MP1, MP3, MP5, NMOS transistor MN1, current source 428, and inverter 423 analogous with PMOS transistors MP2, MP4, MP6, NMOS transistor MN2, current source 427, and inverter 425. Operation of comparator 406 can thus be similar to that of comparator 404 whereby the inverting and non-inverting inputs may correspond with the gate and source of NMOS transistor MN1; and whereby the output of comparator 406 may correspond with the output of inverter 423. As illustrated, the gate of NMOS transistor MN1 is also electrically coupled to receive the signal $V_{FW1}$; and the source of NMOS transistor MN1 is electrically coupled to receive the reference $V_{REF2}$. In response to the signal $V_{FW1}$ exceeding the reference $V_{REF2}$ plus an offset voltage (i.e., a threshold voltage of NMOS transistor MN1), the inverter 423 may change state causing the output signal $V_{OB2}$ to transition low.

The adaptable reference generator 403 includes peak holding circuits 434-435 and a current source 436. Peak holding circuit 434 includes a current source 437, a holding capacitor 443, and a switch 439; similarly, peak holding circuit 435 includes a current source 433, a holding capacitor 441, and a switch 438. Holding capacitor 443 is electrically coupled between the source of NMOS transistor MN2 and local ground SGND; and holding capacitor 441 is electrically coupled between the source of NMOS transistor MN1 and local ground SGND. Additionally, the current source 437 is electrically coupled in parallel with holding capacitor 443, and the current source 433 is electrically coupled in parallel with holding capacitor 441. Also, as illustrated, switch 439 is electrically coupled between the source of NMOS transistor MN2 and the current source 436; and switch 438 is electrically coupled between the source of NMOS transistor MN1 and the current source 436.

The adaptable reference generator 403 may generate the references $V_{REF1}$ and $V_{REF2}$ by virtue of charge delivery to holding capacitors 443 and 441, respectively. Charge may be sourced to holding capacitor 443 from the source of NMOS transistor MN2; and charge may be removed from holding capacitor 443 by current I1 drawn from current source 437. Similarly, charge may be sourced to holding capacitor 441 from the source of NMOS transistor MN1; and charge may be removed from holding capacitor 441 by the current I2 drawn from current source 433. In this way holding capacitors 443 and 441 may respectively provide references $V_{REF1}$ and $V_{REF2}$.

Also, as shown in FIG. 4B, switch 439 may receive a control signal CNT and switch 438 may receive an inverse control signal CNTB (i.e., the inverse of control signal CNT) to alternate connecting current source 436 to holding capacitor 443 and/or to holding capacitor 441. In this way the current source 436 may selectively augment the discharge rate on holding capacitors 443 and 441 with current I4. For instance, when the current source 436 becomes electrically coupled via switch 439 and decoupled via switch 438, then holding capacitor 443 may discharge with a rate determined by the sum of currents I4 and I1 while holding capacitor 441 discharges with a rate determined by current I2. Alternatively, when the current source 436 becomes electrically coupled via switch 438 and decoupled via switch 439, then holding capacitor 441 may discharge with a rate determined by the sum of currents I4 and I2 while holding capacitor 443 discharges with a rate determined by current I2. Additionally, in some embodiments holding capacitors 441 and 443 can have substantially equivalent capacitances, and current I1 can be substantially equivalent to current I2.

As further illustrated below, having the control signal CNT and its inverse control signal CNTB switch according to cycles of a primary switch (e.g., primary switch 132 and/or primary switch 332), the adaptable reference generator 403 may generate the reference $V_{REF1}$ to adapt during select cycles (e.g., odd cycles) and may generate the reference $V_{REF2}$ to adapt during subsequent select cycles (e.g., even cycles). In some embodiments, the references $V_{REF1}$, $V_{REF2}$ may adapt with a peak of secondary signal $V_{FW}$ and become substantially equal to a peak (e.g., a forward flat-top voltage) of secondary signal $V_{FW}$.

In regards to the analog supply rail VDDA and the digital supply rail VDDD, component connections can be implemented to advantageously reduce systematic noise. In this endeavor the sources of PMOS transistors MP0, MP3, MP4, MP5, and MP6 are electrically coupled to analog supply rail VDDA; and the anode of diode 416 and the drain of NMOS transistor MN4 are electrically coupled to digital supply rail VDDD. Also, for additional isolation, the sources of PMOS transistors MP1 and MP2 are electrically coupled to the cathode of diode 416 with filter capacitor 407.

Figure 5:
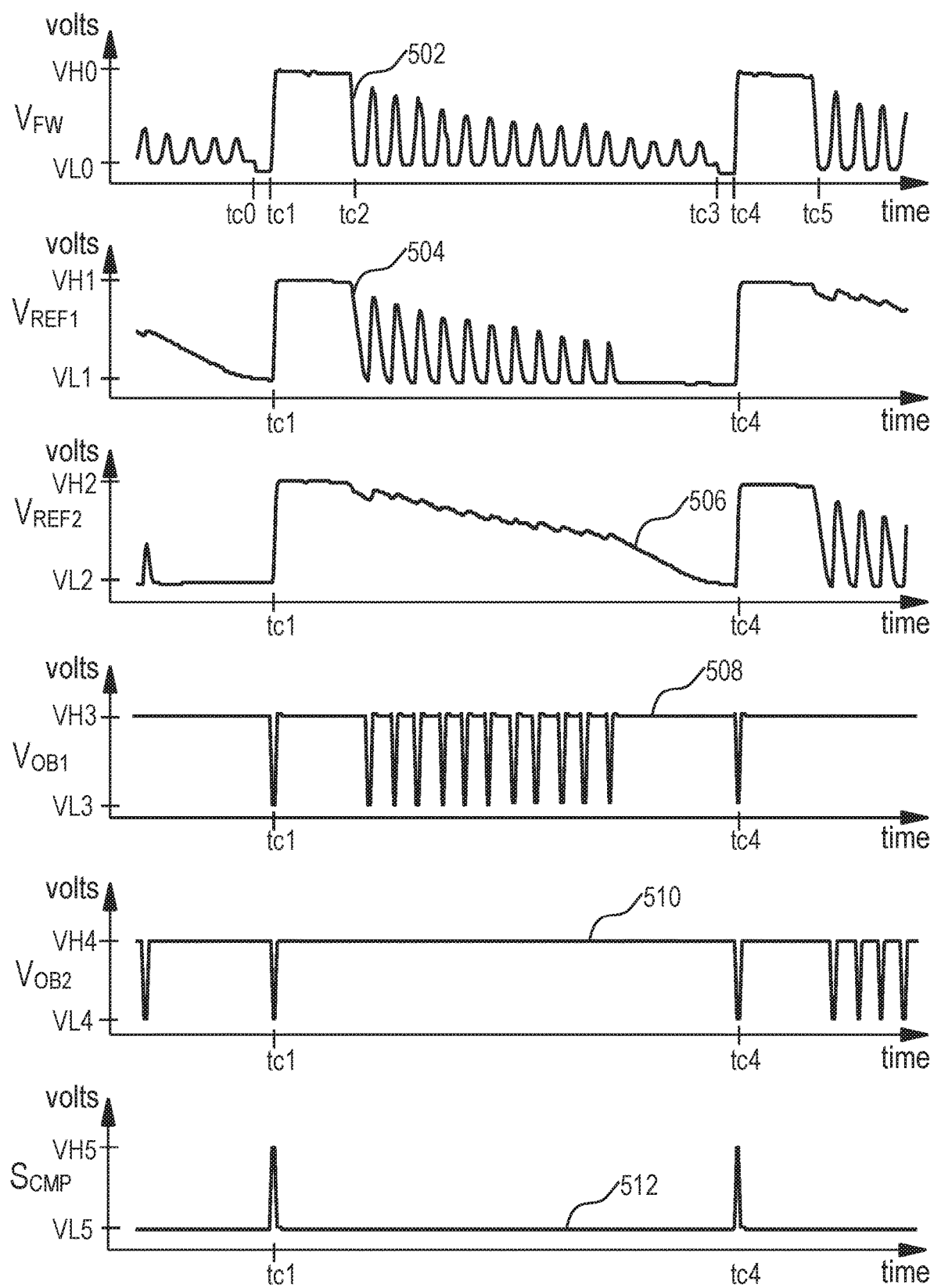
FIG. 5 illustrates switching signal waveforms of a sense circuit including adaptable reference comparators according to an embodiment.

FIG. 5 illustrates switching signal waveforms 502, 504, 506, 508, 510, and 512 of sense circuit 136c including adaptable reference comparators 342 according to an embodiment. Waveforms 502, 504, 506, 508, 510, and 512 are shown in volts versus time. Also, as indicated on the dependent axes, potentials VL0-VL5 can be voltages substantially equal to a local ground potential (e.g., zero volts); and potentials VH0-VH5 can be voltages greater than zero. For instance, in one embodiment VH0-VH2 may be one volt and VH3-VH5 may be five volts.

With reference to FIG. 4A and FIG. 4B, waveform 502 may correspond to secondary signal $V_{FW}$ where transitions at times tc0, tc1, tc3, and tc4 may relate to the primary switch 332 changing state. Also, waveforms 504, 506, 508, and 510 may correspond to reference $V_{REF1}$, reference $V_{REF2}$, output signal $V_{OB1}$, and output signal $V_{OB2}$, respectively; and waveform 512 may correspond to signal $S_{CMP}$.

Similar to waveform 202, waveform 502 can have cycles based on transitions of the primary switch 332. For instance, a cycle may be delineated from a time tc1 (e.g., three milliseconds) to a time tc4 (e.g., three point one milliseconds) when waveform 502 transitions high in response to the primary switch 332 turning off. The cycle may include time tc2 when waveform 502 has an edge (i.e., falling edge) indicative of the onset of discontinuous mode. Additionally, the cycle may include time tc3 when waveform 502 clamps in response to the primary switch 332 turning on. Also, in one embodiment, a cycle period from time tc1 to time tc4 may be between ten and one-hundred microseconds; and a corresponding primary switch on-time (e.g., the flat-bottom interval from time tc0 to time tc1) may be a fraction of the cycle period (e.g., between one and ten microseconds).

According to the teachings herein, the references $V_{REF1}$ and $V_{REF2}$ may adapt periodically (i.e., cycle by cycle) to the secondary signal $V_{FW}$ based on application of control signals CNT, CNTB. For instance, during a cycle beginning at time tc1, control signals CNT and CNTB may be exerted to close switch 439 and open switch 438 thereby causing holding capacitor 443 to discharge more rapidly than holding capacitor 441; and during a subsequent cycle beginning at time tc4, control signals CNT and CNTB may be exerted to open switch 439 and close switch 438 thereby causing holding capacitor 441 to discharge more rapidly than holding capacitor 443. In this way during the cycle beginning at time tc1, comparator 406 may be dedicated for providing output signal $V_{OB2}$ via multiplexer 408 while the holding capacitor 443 for comparator 404 is in a fast discharge state; and during the subsequent cycle beginning at time tc4, comparator 404 may be dedicated for providing output signal $V_{OB1}$ via multiplexer 408 while the holding capacitor 441 for comparator 406 is in a fast discharge state.

For instance, during the cycle beginning at time tc1, while holding capacitor 443 discharges with current I4, reference $V_{REF2}$ (i.e., waveform 506) follows a peak (e.g., an amplitude) of the secondary signal $V_{FW}$ and holds the peak at or above subsequent amplitude variations (i.e., ringing oscillations). In this way reference $V_{REF2}$ adapts to the amplitude (e.g., the peak and/or forward flat-top voltage) of secondary signal $V_{FW}$ at time tc1, and gradually reduces at a rate less than the reduction of the oscillated ring peaks; in this way comparator 406 responds only at time tc1 and tc4. Thus, during the cycle beginning at time tc1, waveform 510 (i.e., output signal $V_{OB2}$) only makes a low transition at time tc1 and tc4, and otherwise, remains substantially constant. In contrast, during the cycle beginning at time tc1, reference $V_{REF1}$ (i.e. waveform 504) follows multiple peaks after time tc2 causing waveform 508 (i.e., output signal $V_{OB1}$) to make multiple low transitions; and in this way waveform 508 may indicate multiple ring peaks. Therefore, during the cycle beginning at time tc1, multiplexer 408 may select output signal $V_{OB2}$ so that signal $S_{CMP}$ (i.e., waveform 512) detects the transition at time tc1 in response to the primary switch turning off.

Maintaining a fast discharge rate on holding capacitor 443 may advantageously avail comparator 404 to be reset and available to detect the transition of secondary signal $V_{FW}$. During the subsequent cycle beginning at time tc4, reference $V_{REF}$ (i.e., waveform 504) may follow a peak (e.g., an amplitude) of the secondary signal $V_{FW}$ and hold the peak at or above subsequent amplitude variations (i.e., ringing oscillations). In this way reference $V_{REF1}$ may likewise adapt to the amplitude (e.g., the peak) of secondary signal $V_{FW}$ at time tc4; and multiplexer 408 may select output signal $V_{OB1}$ to detect the transition at time tc4 in response to the primary switch turning off.

Maintaining a fast discharge rate on holding capacitor 441 may advantageously avail comparator 406 to be available to detect the transition of secondary signal $V_{FW}$ to arbitrary amplitude in response to the primary switch 332 turning off. However, as one of ordinary skill in the art may appreciate, there may be applications where greater or fewer than two comparators 404, 406 can be used to realize a comparators block 401. For instance, in some applications and embodiments, just comparator 406 in combination with holding capacitor 443 may suffice to realize an adaptable reference comparator 142.

Figure 6A:
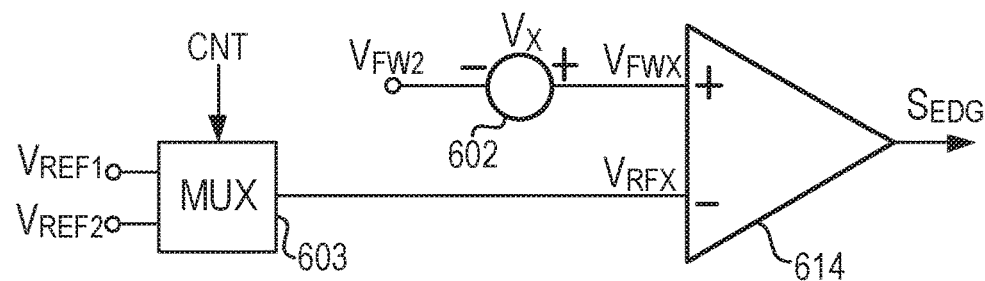
FIG. 6A illustrates an edge detection circuit according to an embodiment.

FIG. 6A illustrates an edge detection circuit 344 according to an embodiment. The edge detection circuit 344 includes a comparator 614, an offset generator 602, and a multiplexer (MUX) 603. As illustrated the offset generator 602 may provide the signal $V_{FWX}$ as a replica of the buffered signal $V_{FW2}$ plus an offset $V_X$ (e.g., one hundred millivolts); and the MUX 603 may provide signal $V_{RFX}$ selected from one of the references $V_{REF1}$, $V_{REF2}$ (i.e., one of the adaptable references) of the comparators block 401.

Figure 7A:
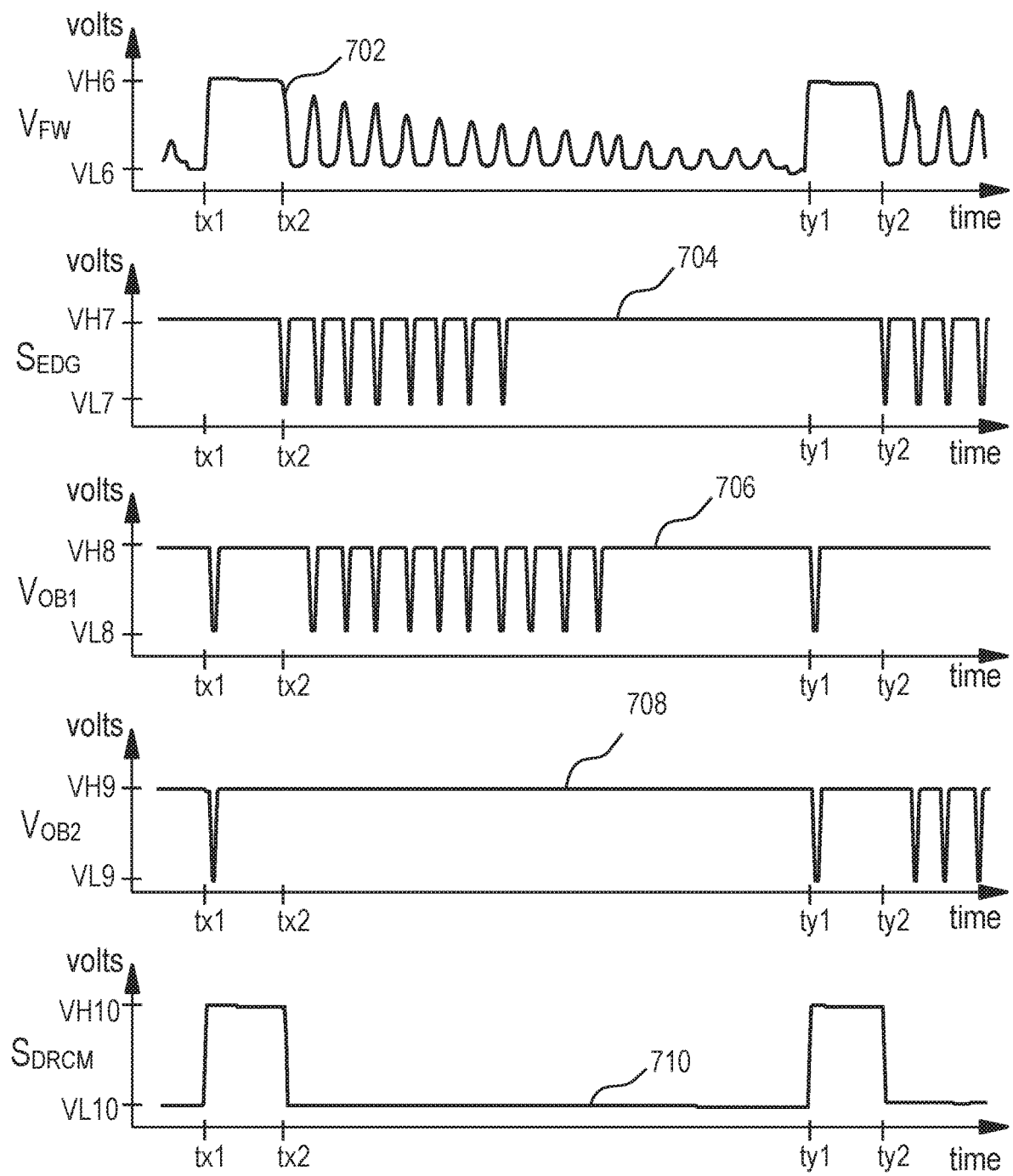
FIG. 7A illustrates switching signal waveforms of a sense circuit including an edge detection circuit according to an embodiment.
Figure 7B:
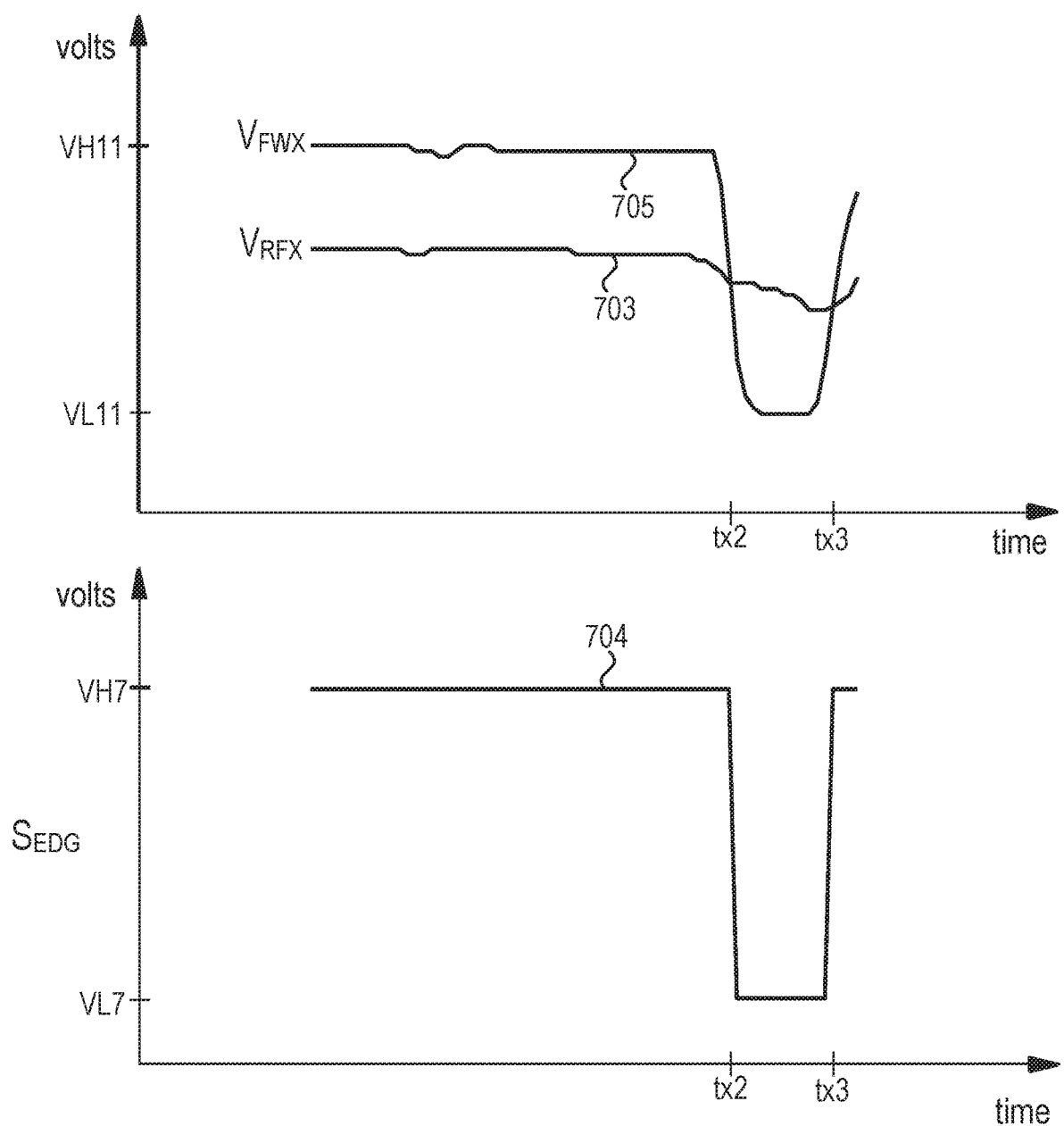
FIG. 7B illustrates edge transitions at a magnified time scale of a switching signal waveform of FIG. 7A.

As will be further illustrated by the waveforms of FIG. 7B, the comparator 614 may provide a signal $S_{EDG}$ based on a comparison of signal $V_{RFX}$ at its inverting terminal with the signal $V_{FWX}$ at its non-inverting terminal. The control signal CNT may be exerted to select the "slower" one of the references $V_{REF1}$, $V_{REF2}$ based on switching cycle. For instance, with reference to the comparators block 401, during a cycle when switch 439 is open, the control signal CNT may select reference $V_{REF1}$ to provide to the non-inverting terminal of comparator 614; while during a cycle when switch 438 is open, the control signal CNT may select reference $V_{REF2}$.

Figure 6B:
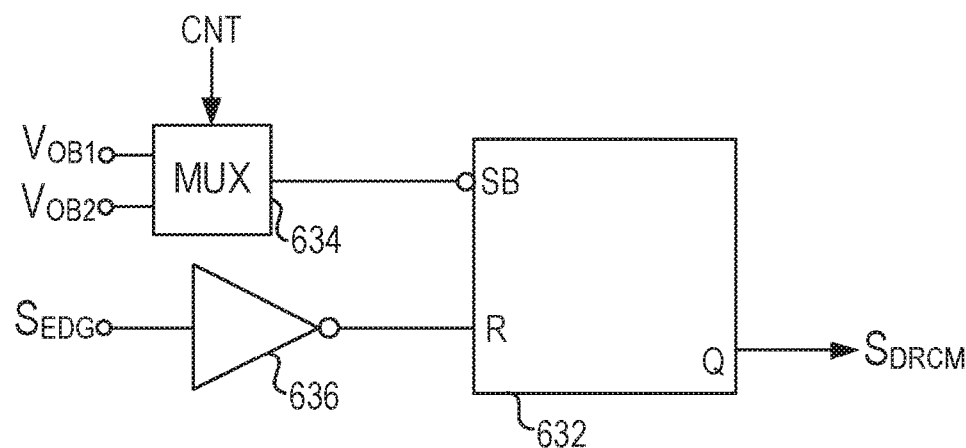
FIG. 6B illustrates a flat-top detection circuit according to an embodiment.

FIG. 6B illustrates a flat-top detection circuit 630 according to an embodiment. The flat-top detection circuit 630 includes a multiplexer (MUX) 634, an inverter 636, and a reset-set (RS) latch 632. The RS latch 632 may provide signal $S_{DRCM}$ at its latch output Q; the latch output Q may latch high in response to a low transition at its set input SB or latch low in response to a high transition at its reset input R. As illustrated, the RS latch 632 receives either the output $V_{OB1}$ or output $V_{OB2}$ to the set input SB based on the control signal CNT to the MUX 634; and the inverter 636 provides the inverse of signal $S_{EDG}$ to the reset input R. As discussed below, the RS latch 632 may provide a latch output signal $S_{DRCM}$ indicative of the secondary signal $V_{FW}$ during a flat-top interval.

FIG. 7A illustrates switching signal waveforms 702, 704, 706, 708, and 710 of a sense circuit 136c including an edge detection circuit 344 according to an embodiment. Waveforms 702, 704, 706, 708, and 710 are shown in volts versus time. Also, as indicated on the dependent axes, potentials VL6-VL10 can be voltages substantially equal to local ground potential (e.g., zero volts); and potentials VH6-VH10 can be voltages greater than zero.

Waveform 702 may correspond to secondary signal $V_{FW}$ where at times tx1 and ty1 the secondary signal $V_{FW}$ amplitude transitions in response to the primary switch 332 turning off; and edges (i.e., falling edges) at times tx2 and ty2 may correspond with an onset of discontinuous mode. Also, waveforms 706 and 708 may correspond to output signals $V_{OB1}$ and $V_{OB2}$, respectively; and waveforms 704 and 710 may correspond to signals $S_{EDG}$ and $S_{DRCM}$, respectively.

As illustrated by waveforms 702 and 704, signal $S_{EDG}$ transitions low in response to edges (i.e., falling edges) at times tx2 and ty2 but also transitions low to one or more of the falling edges during ringing (e.g., during periods between times tx2 to ty1 and following time ty2). The flat-top detection circuit 630 provides signal $S_{DRCM}$ to indicate the forward flat-top voltages of waveform 702 (i.e., secondary signal $V_{FW}$). Based on control signal CNT, signal $S_{DRCM}$ (i.e., waveform 710) may latch high at time tx1 with output signal $V_{OB2}$ (i.e., waveform 708) and again latch high with output signal $V_{OB1}$ (i.e., waveform 706) at time ty1. Also, the signal $S_{DRCM}$ may remain high during the flat-top intervals from time tx1 to time tx2 and time ty1 to ty2 according to a falling edge of signal $S_{EDG}$ at time tx2 and time ty2.

In this way signal $S_{DRCM}$ may indicate the duration of flat-top intervals (i.e., time tx1 to time tx2 and time ty1 to time ty2). Because the flat-top intervals may also indicate when the secondary windings (e.g., any of secondary windings 115, 116, 316) are transferring energy with non-zero current, information relating to the flat-top intervals may advantageously enhance control in power conversion system 100. For instance, the signal $S_{DRCM}$ may be used to indicate when diode D1 and/or diode D2 conducts.

Additionally, the signal $S_{DRCM}$ may also be used by a secondary control module (e.g., secondary control module 124) to determine if the power conversion system (e.g., power conversion system 100) has entered continuous conduction mode. For instance, the flat-top detection circuit 630 may determine that the power conversion system 100 is operating in continuous conduction mode (i.e., CCM mode) when the flat-top intervals exceed a switching period. Under these conditions, the signal $S_{DRCM}$ may remain high during a complete switching signal; and upon detecting CCM mode, the secondary control module (e.g., secondary control module 124) may communicate the coupling signal FL so as to reduce and/or to correct the switching frequency of the primary switch (e.g., primary switch 132 and/or primary switch 332).

FIG. 7B illustrates edge transitions at a magnified time scale of the switching signal waveform 704 of FIG. 7A. Waveform 704 may correspond with the signal $S_{EDG}$ magnified during a low transition at time tx2 coinciding with an edge (i.e., falling edge). With reference to FIG. 6A, comparator 614 may provide signal $S_{EDG}$ (i.e., waveform 704) based on the comparison of signal $V_{RFX}$ (i.e., waveform 703) at its inverting terminal with the signal $V_{FWX}$ (i.e., waveform 705) at its non-inverting terminal. During a cycle including time tx2, the control signal CNT may select reference $V_{REF2}$ as the "slower" one of the references. According to the discussion of edge detection circuit 344, waveform 705 (i.e., signal $V_{FWX}$) can have an offset $V_X$ with respect to the buffered signal $V_{FW2}$. Thus, waveform 705 may be shifted to voltages between a maximum potential VH11 and a minimum potential VL11; while signal $V_{RFX}$ (i.e., waveform 703) decays slowly between the maximum and minimum potentials VH11, VL11.

As illustrated, waveform 704 (i.e., signal $S_{EDG}$) transitions from high to low (i.e., exhibits a falling edge) at time tx2 when waveform 705 (i.e., signal $S_{EDG}$) crosses waveform 703 (i.e., signal $V_{RFX}$) to indicate a falling edge. Waveform 704 again transitions high at time tx3 when waveform 705 crosses waveform 703. Also, as shown in FIG. 7A, in addition to indicating a falling edge at time tx2, waveform 704 may also indicate falling edges during the ringing interval following time tx2.

Figure 8:
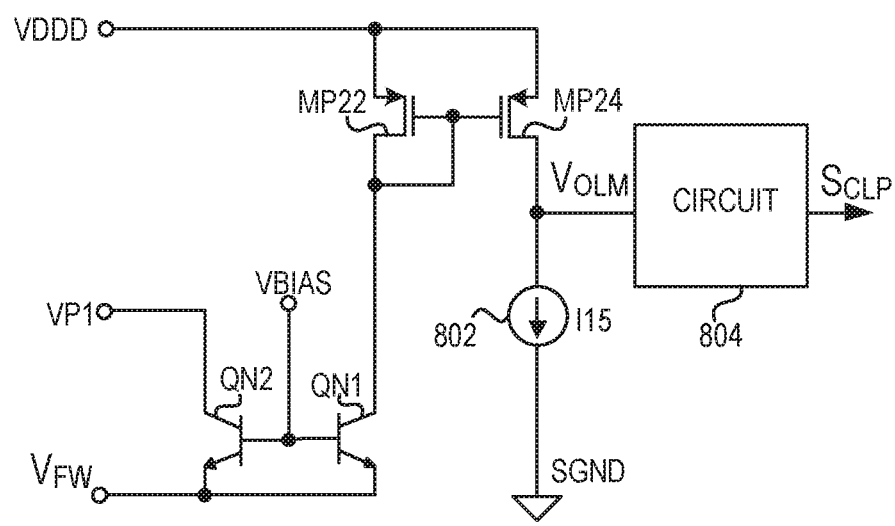
FIG. 8 illustrates a clamp detection circuit according to an embodiment.

FIG. 8 illustrates a clamp detection circuit 346 according to an embodiment. Clamp detection circuit 346 includes NPN bipolar junction transistors (BJTs) QN1, QN2, PMOS transistors MP22, MP24, current source 802, and a circuit block 804. A collector of BJT QN2 is electrically coupled to a power supply potential VP1, and the sources of PMOS transistors are electrically coupled to digital supply rail VDDD relative to local ground SGND. The gate and drain of PMOS transistor MP22 are electrically coupled with the gate of PMOS MP24 allowing PMOS transistors MP22 and MP24 to operate as a current mirror and/or current multiplier. The drain of PMOS transistor MP24 is electrically coupled to the current source 802 to provide a trigger signal $V_{OLM}$ to the circuit block 804. The circuit block 804, in turn, may provide the signal $S_{CLP}$ in response to the trigger signal $V_{OLM}$.

The bases and emitters of NPN BJTs QN1-QN2 are electrically coupled to receive a bias potential $V_{BIAS}$ and the secondary signal $V_{FW}$, respectively. NPN BJT QN1 may be a scaled replica of NPN BJT QN2; for instance NPN BJT QN2 may have an active emitter periphery of thirty two times that of NPN BJT QN1 such that an emitter current of BJT QN2 is a multiple of (e.g., thirty two times that of) an emitter current of BJT QN1. In this way emitter currents from NPN BJTs QN1-QN2 may source a current (e.g., current $I_{R1}$) and clamp secondary signal $V_{FW}$; concurrently NPN BJT QN1 may provide current to PMOS transistor MP22 so that PMOS transistor MP24 provides a current relating to (i.e., proportional to) the emitter currents from NPN BJTs QN1-QN2 (e.g., current $I_{R1}$).

Furthermore, the bias potential $V_{BIAS}$ may be selected so that the secondary signal $V_{FW}$ clamps to the local ground potential SGND (i.e., to zero volts); and as one of ordinary skill in the art may appreciate, clamping the secondary signal $V_{FW}$ may advantageously protect circuit elements and components (e.g. circuit components of secondary control module 124). Alternatively, and additionally, the bias potential $V_{BIAS}$ may be selected such that the secondary signal $V_{FW}$ clamps to potentials other than ground potential SGND According to the teachings herein, the clamp detection circuit 346 may distinguish clamping during a flat-bottom interval (e.g., from time tc3 to time td1 of waveform 202) from clamping during a ringing interval (e.g., from time tr1 to time tr2 of waveform 202). When the secondary signal $V_{FW}$ becomes clamped (e.g., to zero volts), then the drain current of MP24 can source a mirrored and/or scaled (e.g., multiple) value of collector current of NPN BJT QN1. Current I15 of current source 802 may be selected and/or tailored to have a value which causes trigger signal $V_{OLM}$ to transition from low to high in response to secondary signal clamping during a flat-bottom interval (i.e., in response to the primary switch turning on). For instance, with reference to waveforms 201-202, the value of current I15 may be selected based, at least in part, upon Equation 2 such that trigger signal $V_{OLM}$ may transition from low to high in response to secondary signal $V_{SEC}$ attaining a magnitude substantially equal to a flat-bottom voltage $V_{SB}$. Alternatively, and additionally, the value of current I15 may be selected such that the trigger signal $V_{OLM}$ may avoid transition from low to high in response to secondary signal $V_{SEC}$ reaching the lower secondary ringing voltage $V_{SR}$ during a ringing interval (e.g., from time tr1 to time tr2).

Additionally, the circuit block 804 may further distinguish the flat-bottom interval based, at least in part, upon time. For instance, the circuit block 804 may include a timer circuit and/or a deglitching filter which causes the signal $S_{CLP}$ to change state (e.g., transition from low to high) after the trigger signal $V_{OLM}$ triggers high for a select period of time (e.g., several hundred nanoseconds) during a flat-bottom interval (e.g., flat-bottom interval tc3 to td1). The select period of time may be chosen such that the circuit block 804 suppresses a transition of signal $S_{CLP}$ during a ringing interval (e.g., from time tr1 to time tr2) while allowing a transition of signal $S_{CLP}$ during a flat-bottom interval (e.g., flat-bottom interval tc3 to td1).

Figure 9:
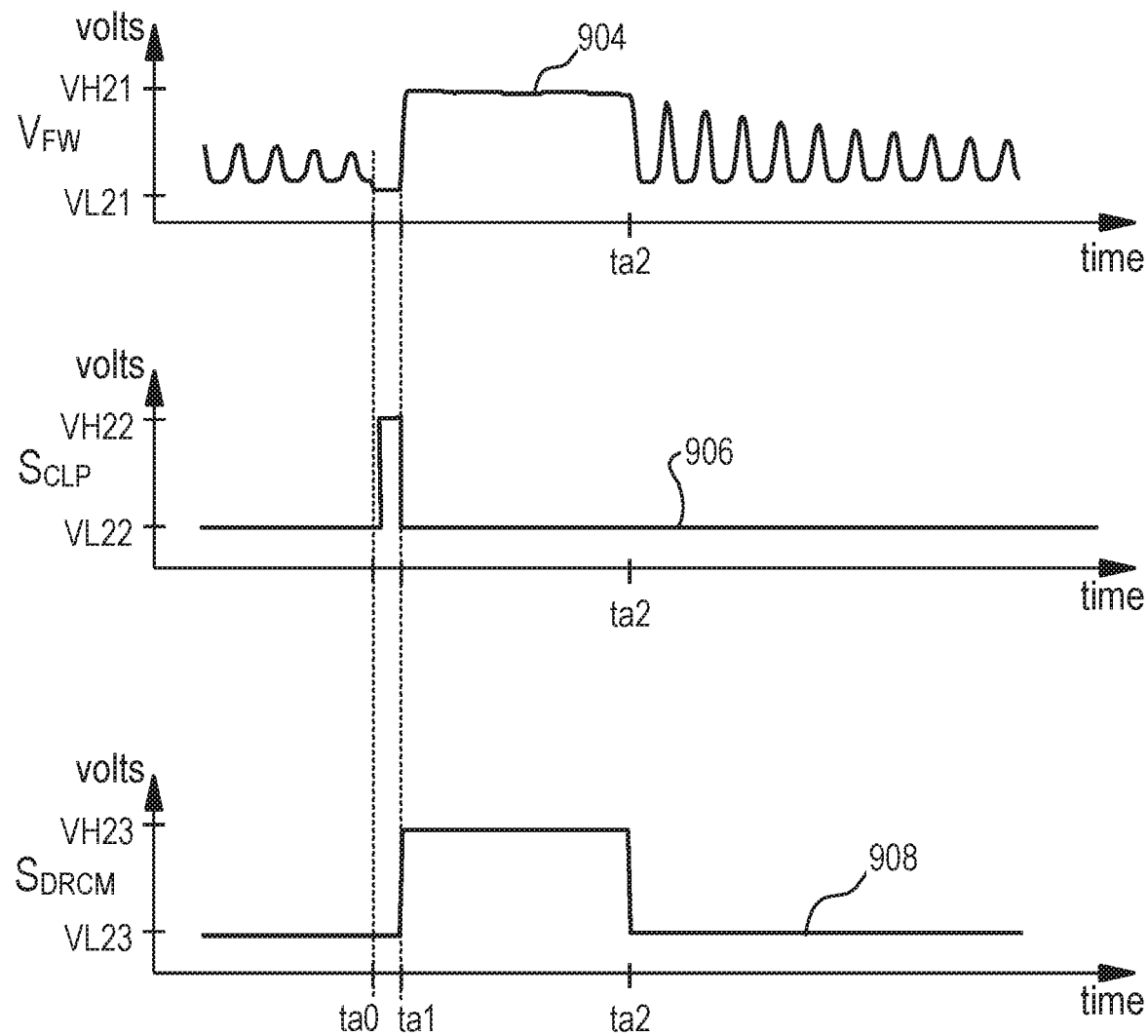
FIG. 9 illustrates switching signal waveforms of a sense circuit including a clamp detection circuit according to an embodiment.

FIG. 9 illustrates switching signal waveforms 904, 906, and 908 of a sense circuit including a clamp detection circuit 346 according to an embodiment. Waveforms 904, 906, and 908 are illustrated in volts versus time; and dependent axes are in units of volts. Dependent axes are further scaled by potentials VL21-VL23 and VH21-VH23 whereby potentials VL21-VL23 may be voltages substantially equal to zero and potentials VH21-VH23 can be voltages greater than zero.

Waveform 904 may correspond to secondary signal $V_{FW}$. As shown by waveform 904, a flat-bottom interval may begin at time ta0 in response to the primary switch (e.g., primary switch 132 and/or primary switch 332) turning on; in turn, the secondary signal $V_{FW}$ may become clamped low until time ta1 when the primary switch (e.g., primary switch 132 and/or primary switch 332) turns off. As illustrated, waveform 906, corresponding to signal $S_{CLP}$, may transitions high after time ta0 and then returns low at time ta1. In contrast, waveform 908, corresponding to signal $S_{DRCM}$, transitions high at time ta1 and then transitions low at time ta2 to provide information relating to the flat-top interval from time ta1 to time ta2.

Figure 10:
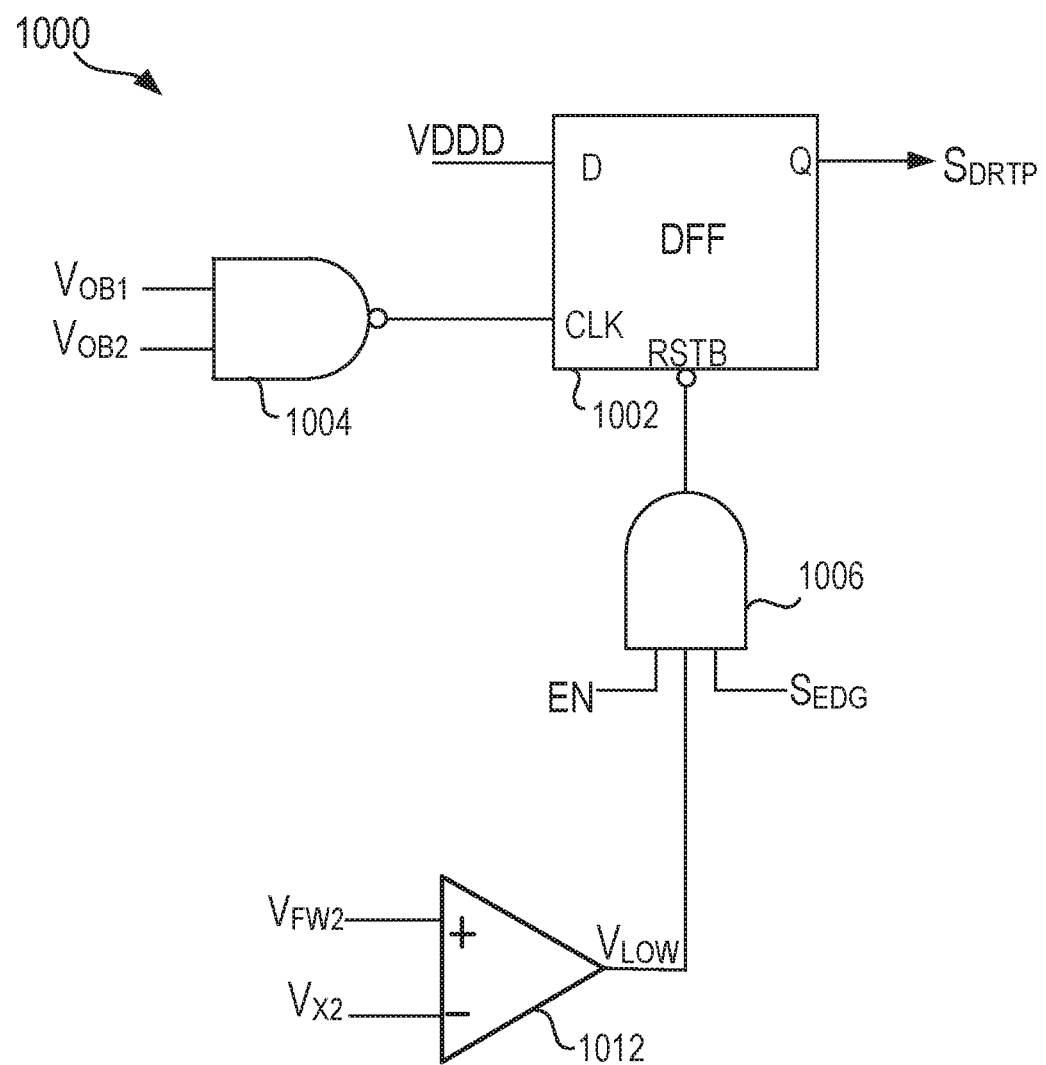
FIG. 10 illustrates a top detection circuit according to an embodiment.

FIG. 10 illustrates a top detection circuit 1000 according to an embodiment. Top detection circuit 1000 includes a D-type flip flop (DFF) 1002, an NAND gate 1004, an AND gate 1006, and a comparator 1012. The D input of DFF 1002 is electrically coupled to the digital supply rail VDDD, and the clock input CLK is electrically coupled to an output of NAND gate 1004. NAND gate 1004 may drive the clock input CLK based on the logical NAND of output signals $V_{OB1}$ and $V_{OB2}$. Additionally, the DFF 1002 may be reset at its inverted reset input RSTB by AND gate 1006. AND gate 1006 may drive the inverted reset input RSTB based on a logical AND of an enable signal EN, the signal $S_{EDG}$, and a signal $V_{LOW}$. Comparator 1012 may provide signal $V_{LOW}$ to the AND gate 1006 based on a comparison of buffered signal $V_{FW2}$ at its non-inverting terminal to a reference signal $V_{X2}$ at the inverting input. In one embodiment the reference signal $V_{X2}$ can be a potential (i.e., voltage) between one hundred and four hundred millivolts, selected such that signal $V_{LOW}$ is asserted high when the secondary signal $V_{FW}$ exceeds the forward flat-bottom voltage $V_{CL}$ (e.g., exceeds zero volts). Also, DFF 1002 may provide signal $S_{DRTP}$ at its Q output in response to the clock input CLK and inverted reset input RSTB.

Accordingly, signal $S_{DRTP}$ (i.e., the Q output of DFF 1002) may clock high when either of output signals $V_{OB1}$, $V_{OB2}$ transitions low; and signal $S_{DRTP}$ may reset low when the enable signal EN is low, when the signal $S_{EDG}$ is low, or when the signal $V_{LOW}$ is low (i.e., when the buffered signal $V_{FW2}$ exceeds the reference signal $V_{X2}$). For instance, with reference to waveform 704, signal $S_{DRTP}$ may reset low at time tx2 when signal $S_{EDG}$ transitions low. Additionally, DFF 1002 may be further configured to be reset dominant such that the signal $S_{DRTP}$ remains low while its inverted reset input $R_{STB}$ remains low.

Figure 11:
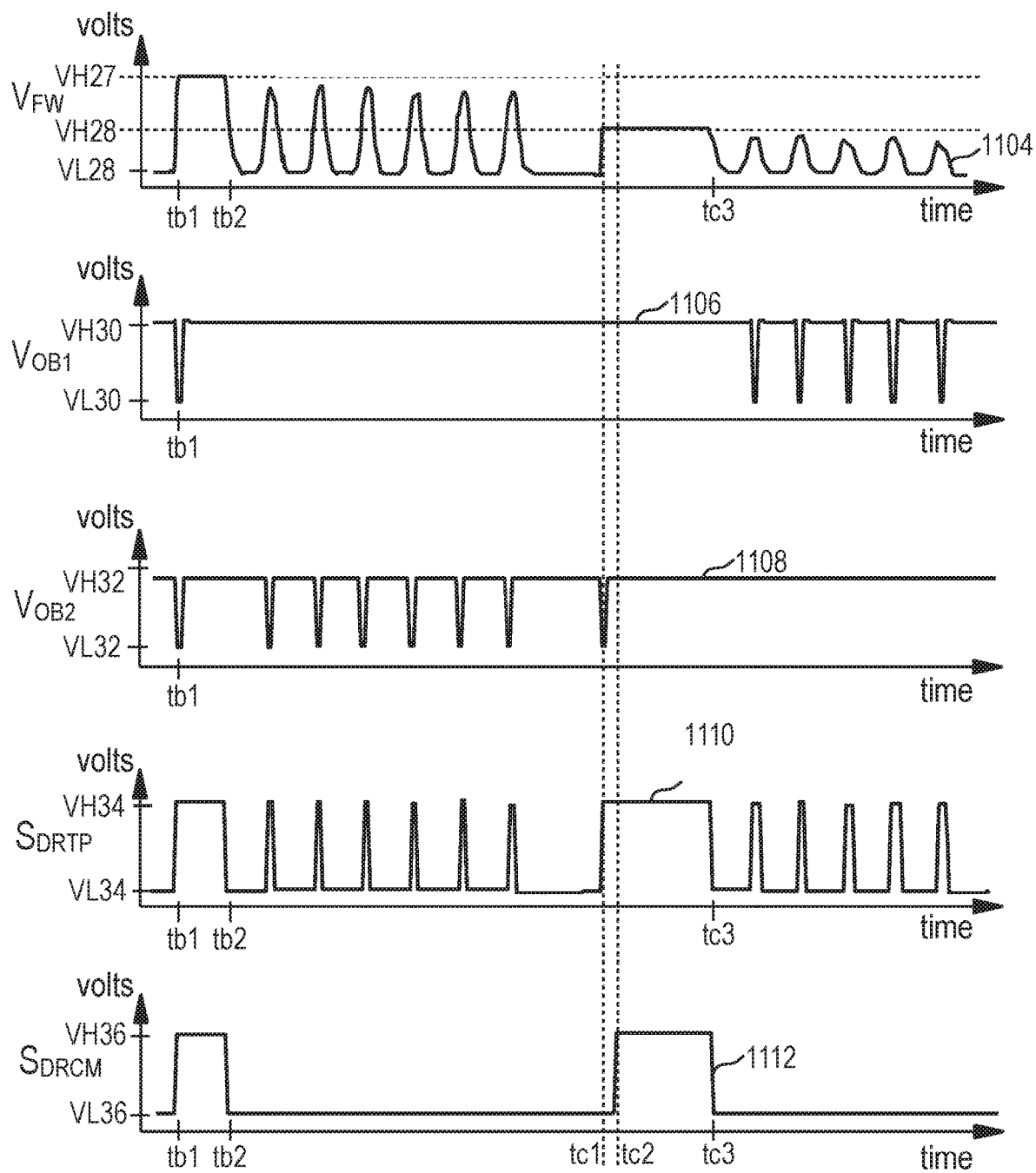
FIG. 11 illustrates switching signal waveforms of a sense circuit including a top detection circuit according to an embodiment.

FIG. 11 illustrates switching signal waveforms 1104, 1106, 1108, 1110, and 1112 of a sense circuit 136c including a top detection circuit 1000 according to an embodiment. Waveform 1104, corresponding to secondary signal $V_{FW}$, is plotted in volts versus time and delineated between low potential VL28 and potentials VH27, VH28. As illustrated, at time tb1 waveform 1104 transitions toward potential VH27 (e.g., two volts), and at time tc1 transitions toward potential VH28 (e.g., six hundred millivolts). The amplitude of waveform 1104 at time tb1 (i.e., forward flat-top voltage) may be higher than that beginning the subsequent cycle at time tc1 due, in part, to a loss of regulation at the secondary side. For instance, the secondary signal $V_R$ may droop and/or go out of regulation when the input voltage $V_{IN}$ is a rectified ac voltage having wide-swing variation; alternatively, and additionally, the forward flat-top voltage may be higher at time tb1 due to the pass switch 148 turning on at time tc1. Also, as illustrated, waveform 1104 exhibits edges (i.e., falling edges) at times tb2 and tc3 corresponding to an onset of discontinuous mode. Thus, the secondary signal $V_{FW}$ has a forward flat-top voltage of potential VH27 during a flat-top interval from time tb1 to time tb2 and a forward flat-top voltage of potential VH28 during a flat-top interval from time tc1 to time tc3.

Additionally, waveforms 1106 and 1108 may respectively correspond to output signals $V_{OB1}$ and $V_{OB2}$ of comparators block 401; and waveforms 1110 and 1112 may respectively correspond to signals $S_{DTRP}$ and $S_{DRCM}$. Waveforms 1106, 1108, 1110, and 1112 are plotted in volts versus time having dependent axes scaled by potentials VL30, VL32, VL34, VL36, substantially equal to zero, and potentials VH30, VH32, VH34, VH36, having values greater than zero (e.g., five volts).

In accordance with the teachings herein, output signal $V_{OB1}$ from comparator 404 may be selected during the cycle beginning at time tb1. Waveform 1106 transitions at time tb1; however, as illustrated, waveform 1106 does not transition at time tc1 because capacitor 443 may maintain the reference $V_{REF1}$ to be greater than potential VH28 (i.e., greater than the forward flat-top voltage at time tc1). Herein lays an advantage of additional comparator 406 whereby during the subsequent cycle, output signal $V_{OB2}$ (i.e., waveform 1108) may be selected. As illustrated, waveform 1108 may transition low at time tc1 according to the embodiment of FIG. 4A and FIG. 4B.

Alternatively, and additionally, under conditions of very low voltages (e.g., when the forward flat-top voltage of potential VH28 is less than preceding ringing amplitudes) a timer and/or a delay circuit may be used to detect the flat-top interval from time tc1 to time tc3. For instance, as shown in FIG. 11, waveform 1110 (i.e., signal $S_{DRTP}$) may transition at time tc1 coincident with waveform 1108 (i.e., output signal $V_{OB2}$). A secondary control module (e.g., secondary control module 124) and/or the sense circuit (e.g., any one of sense circuits 136, 136a-c) may include a timer and/or delay circuit to determine when waveform 1110 remains high for a minimum time lapse (e.g., eight-hundred nanoseconds). In this way the sense circuit (e.g., sense circuit 136, 136a-c) may recognize a flat-top interval of secondary signal $V_{FW}$ (i.e., waveform 1104) initiated at time tc1; and in response, the waveform 1112 (e.g., signal $S_{DRCM}$) may transition high at a delayed time tc2. Thus, waveform 1112 (i.e., signal $S_{DRCM}$ from the flat-top detection circuit 630) may indicate a flat-top interval starting at a delayed time tc2 with respect to time tc1.

Also, as described above, waveform 1110 (i.e., signal $S_{DRTP}$) may also provide tops during ringing intervals. By providing the tops during a ringing interval, signal $S_{DRTP}$ may be synchronized with a ringing frequency (i.e., a relaxation frequency) and/or a multiple of the ringing frequency; in this way the ringing frequency becomes available to a secondary control module (e.g., secondary control module 124). For instance, during a ringing interval, a period may be estimated from the time differential between adjacent tops of waveform 1110.

In one application, knowledge of the period may allow valley switching during a ringing interval, whereby a secondary control module (e.g., secondary control module 124) communicates a location of a valley (e.g., a lower secondary ringing voltage $V_{SR}$ of waveform 201). Accordingly, a valley may be determined (i.e., located temporally) at one half the period from a nearby "top"; and the secondary control module 124 may, based on information of the ringing frequency, communicate the coupling signal FL to a primary control module (e.g., primary control module 121). The primary control module 121 may, in turn, control the primary switch (e.g., primary switch 132 and/or primary switch 332) to turn on at a time where the ringing has a "low" value (i.e., a valley). Thus, having information of the ringing frequency may avail valley switching to enhance performance and reduce switching losses.

Figure 12A:
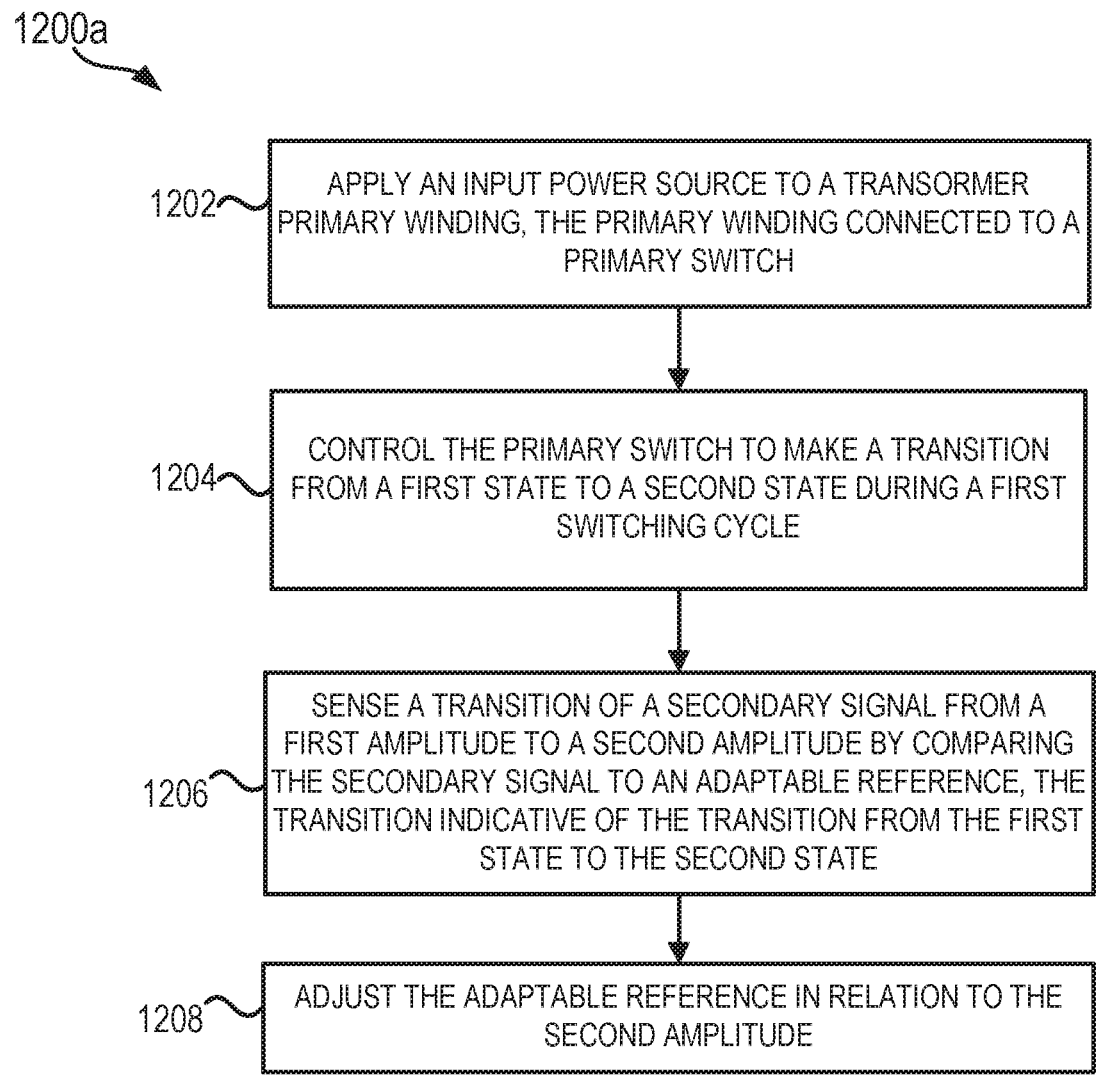
FIG. 12A illustrates a conceptual flow diagram for detecting a variable amplitude switching signal at a secondary winding in a power conversion system according to an embodiment.

FIG. 12A illustrates a conceptual flow diagram 1200a for detecting a variable amplitude switching signal (e.g., secondary signal $V_{FW}$) at a secondary winding in a power conversion system according to an embodiment. The conceptual flow diagram 1200a includes steps 1202, 1204, 1206, and 1208. Beginning with step 1202, an input power source (i.e., input voltage $V_{IN}$) may be provided to a primary winding (e.g., primary winding 112 and/or 312). The primary winding 112 may connect to a primary switch (e.g., primary switch 132 and/or 332). Next, step 1204 may correspond with controlling a transition of the primary switch 132. The primary switch 132 may transition from a first state (e.g., an on state) to a second state (e.g., an off state). This may correspond to turning of primary switch 132 during a first switching cycle, and at time t1 the waveform 203 may transition in phase with the primary switch voltage $V_D$.

In the following step 1206 a sense circuit (e.g., sense circuit 136, 136a, 136b, and/or 136c) may be used to sense a transition of a secondary signal (e.g., secondary signal $V_{FW}$). The secondary signal $V_{FW}$ may transition from a first amplitude (e.g., amplitude AB1) to a second amplitude (e.g., amplitude AT1); and an adaptable reference comparator 142 and/or adaptable reference comparators 342 may compare the secondary signal $V_{FW}$ with an adaptable reference (e.g., reference $V_{REF}$, $V_{REF1}$, and/or $V_{REF2}$). The transition of the secondary signal $V_{FW}$ from the first amplitude to the second amplitude may be indicative of the transition of the primary switch 132 transitioning from the first state to the second state (e.g., indicative of turning off). In the next step 1208 the adaptable reference (e.g., reference $V_{REF}$, $V_{REF1}$, and/or $V_{REF2}$) may adjust with respect to the second amplitude (e.g., amplitude AT1). For instance, reference $V_{REF1}$ may increase when secondary signal $V_{FW}$ increases to amplitude AT1.

Figure 12B:
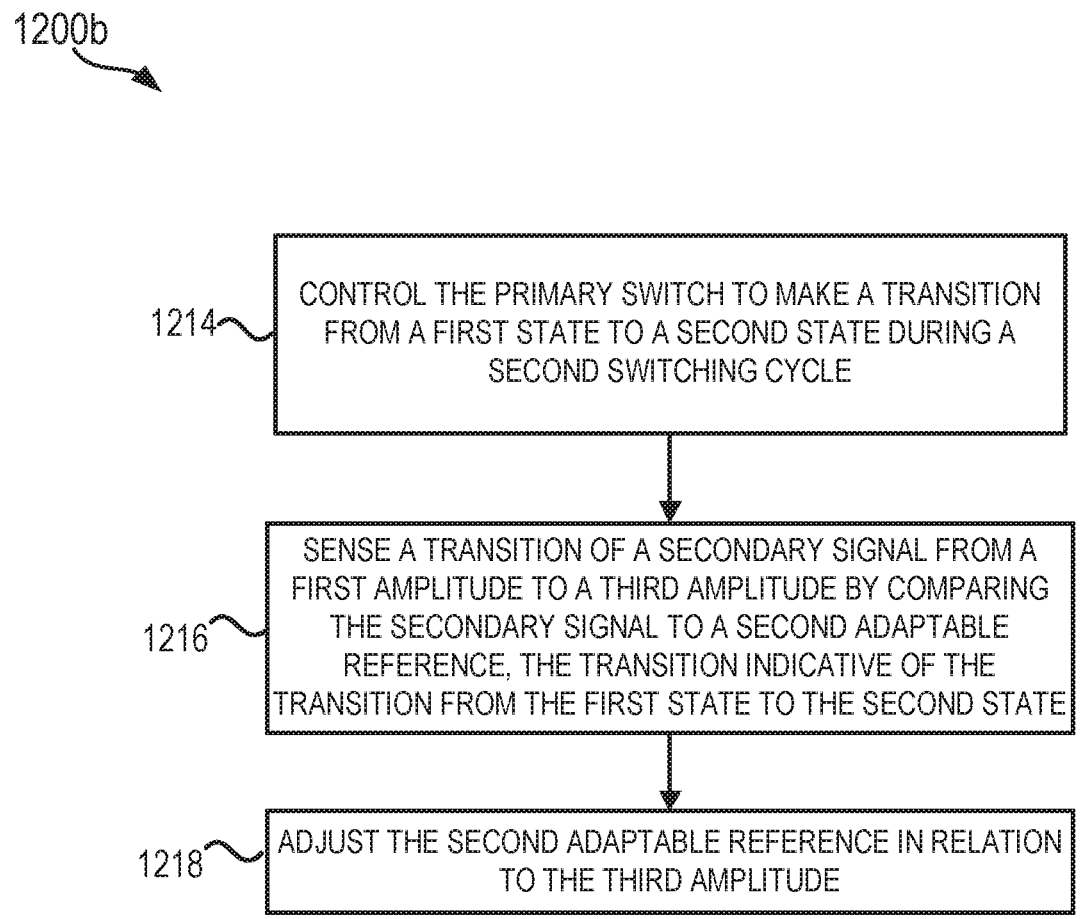
FIG. 12B illustrates a conceptual flow diagram for detecting a variable amplitude switching signal at a secondary winding in a power conversion system according to another embodiment.

FIG. 12B illustrates a conceptual flow diagram 1200b for detecting a variable amplitude switching signal at a secondary winding in a power conversion system according to another embodiment. The conceptual flow diagram 1200b includes additional steps 1214, 1216, and 1218. Step 1214 may correspond to a subsequent, second switching cycle whereby the primary switch 132 may be controlled to transition from the first state (e.g., on state) to the second state (e.g., off state). The next step 1216 may correspond to sensing a transition of secondary signal $V_{FW}$ at time t6. The secondary signal $V_{FW}$ may transition from a first amplitude (e.g., amplitude AB1) to a third amplitude (e.g., amplitude AT2); and adaptable reference comparators 342 may compare the secondary signal $V_{FW}$ with an adaptable reference (e.g., reference $V_{REF1}$, and/or reference $V_{REF2}$). The transition of the secondary signal $V_{FW}$ from the first amplitude to the third amplitude may be indicative of the primary switch 132 transitioning from the first state to the second state (e.g., indicative of turning off). In the next step 1218 the adaptable reference may adjust with respect to the second amplitude (e.g., amplitude AT2).

The above description of illustrated examples of the present disclosure, including what is described in the Abstract, are not intended to be exhaustive or to be limitation to the precise forms disclosed. While specific embodiments of, and examples understanding for sensing a variable amplitude switching signal from a secondary winding in a power conversion system are described herein for illustrative purposes, various equivalent modifications are possible without departing from the broader spirit and scope of the present disclosure. Indeed, it is appreciated that the specific example voltages, currents, frequencies, power range values, times, etc., are provided for explanation purposes and that other values may also be employed in other embodiments and examples in accordance with the teachings herein.

The invention claimed is:

1. A power conversion system comprising:
a switching transformer having a primary winding and a secondary winding, the primary winding electrically coupled to receive an input power supply signal and the secondary winding electrically coupled to provide a secondary signal;
a primary switch electrically coupled to the primary winding and configured to switch between a first state and second state during at least one switching cycle, wherein during the at least one switching cycle the secondary signal transitions from a first amplitude to a second amplitude in response to the primary switch transitioning from the first state to the second state; and
a sense circuit comprising:
an adaptable reference generator configured to provide an adaptable reference and to adjust the adaptable reference in relation to the second amplitude, wherein prior to the at least one switching cycle the adaptable reference has a first value less than the second amplitude; and
a first comparator configured to compare the secondary signal with the adaptable reference and to change state when the secondary signal transitions from the first amplitude to the second amplitude.

2. The power conversion system of claim 1, wherein the input power supply signal comprises a variable amplitude voltage.

3. The power conversion system of claim 1, wherein the input power supply signal comprises a rectified alternating current (ac) voltage.

4. The power conversion system of claim 1, wherein the secondary signal is a voltage.

5. The power conversion system of claim 1, wherein the first state is an on state and the second state is an off state.

6. The power conversion system of claim 1,
wherein during the at least one switching cycle the secondary signal transitions to a third amplitude subsequent to the primary switch transitioning from the first state to the second state; and
wherein the adaptable reference generator is configured to adjust the adaptable reference to have a second value, whereby the first comparator holds state when the secondary signal transitions to the third amplitude.

7. The power conversion system of claim 1, wherein the first comparator comprises an n-channel metal oxide semiconductor (NMOS) transistor having a gate configured to receive a gate voltage proportional to the secondary signal and a source coupled to a holding capacitor, the holding capacitor configured to provide the adaptable reference.

8. The power conversion system of claim 1,
wherein during the at least one switching cycle the secondary signal transitions from the second amplitude towards the first amplitude so as to exhibit an edge; and
wherein the sense circuit further comprises an edge detection circuit, the edge detection circuit configured to provide an edge detection signal in response to detecting the edge.

9. The power conversion system of claim 8, wherein the secondary signal transitions from the second amplitude towards the first amplitude so as to exhibit the edge in response to a discontinuous mode condition.

10. The power conversion system of claim 1, the sense circuit further comprising:
a clamp detection circuit, the clamp detection circuit configured to detect when the primary switch operates in the first state.

11. The power conversion system of claim 1,
wherein the sense circuit comprises a second comparator configured to compare a second adaptable reference with the secondary signal;
wherein the at least one switching cycle comprises a first switching cycle and a second switching cycle;
wherein during the first and the second switching cycles, the primary switch transitions from the first state to the second state;
wherein during the first switching cycle, the secondary signal transitions from the first amplitude to the second amplitude, and during the second switching cycle, the secondary signal transitions from the first amplitude to a third amplitude in response to the primary switch transitioning from the first state to the second state;
wherein during the first switching cycle, the first comparator changes state in response to the primary switch transitioning from the first state to the second state; and
wherein during the second switching cycle, the second comparator changes state in response to the primary switch transitioning from the first state to the second state.

12. The power conversion system of claim 11, wherein the second switching cycle is subsequent to the first switching cycle.

13. The power conversion system of claim 12, wherein the adaptable reference generator is configured to adjust the second adaptable reference in relation to the third amplitude.

14. The power conversion system of claim 11,
wherein prior to the first switching cycle the adaptable reference generator is configured to adjust the adaptable reference to have a first value, the first value less than the second amplitude, whereby the first comparator changes state when the secondary signal transitions from the first amplitude to the second amplitude; and
wherein prior to the second switching cycle the adaptable reference generator is configured to adjust the second adaptable reference to have a second value, the second value less than the third amplitude, whereby the second comparator changes state when the secondary signal transitions from the first amplitude to the third amplitude.

15. A method of sensing a secondary signal in a power conversion system comprising:
applying an input power source to a primary winding, the primary winding coupled to a primary switch;
controlling the primary switch to make a transition from a first state to a second state during a first switching cycle;
sensing a transition of a secondary signal from a first amplitude to a second amplitude by comparing the secondary signal to an adaptable reference, wherein the transition of the secondary signal from the first amplitude to the second amplitude is indicative of the transition from the first state to the second state;
adjusting the adaptable reference in relation to the second amplitude; and
controlling the primary switch to make a transition from the first state to the second state during a second switching cycle;
sensing a transition of the secondary signal from the first amplitude to a third amplitude by comparing the secondary signal to a second adaptable reference, wherein the transition of the secondary signal from the first amplitude to the third amplitude is indicative of the transition from the first state to the second state; and
adjusting the second adaptable reference in relation to the third amplitude.

16. The method of claim 15, wherein the first state is an on state and the second state is an off state.

17. The method of claim 15, wherein the input power source comprises a variable amplitude signal.

18. The method of claim 15, wherein the secondary signal comprises a voltage.

19. The method of claim 15, wherein adjusting the adaptable reference in relation to the second amplitude comprises increasing the adaptable reference.

20. The method of claim 15, further comprising:
detecting an edge transition of the secondary signal from the second amplitude towards the first amplitude using an edge detection circuit.

21. The method of claim 15, further comprising:
detecting when the primary switch operates in the first state.

22. The method of claim 15, wherein adjusting the adaptable reference in relation to the second amplitude comprises:
coupling a gate signal indicative of the secondary signal to a gate of an NMOS transistor;
coupling a source of the NMOS transistor to a holding capacitor; and
providing the adaptable reference on the holding capacitor.

23. The method of claim 22, wherein providing the adaptable reference on the holding capacitor comprises:
providing the adaptable reference on the holding capacitor during the first switching cycle.

24. The method of claim 15, wherein adjusting the second adaptable reference in relation to the third amplitude comprises increasing the second adaptable reference.

25. The method of claim 15, wherein adjusting the second adaptable reference in relation to the third amplitude comprises:
coupling a gate signal indicative of the secondary signal to a gate of an NMOS transistor;
coupling a source of the NMOS transistor to a holding capacitor; and
providing the second adaptable reference on the holding capacitor.

26. The method of claim 25, wherein providing the second adaptable reference on the holding capacitor comprises:
providing the second adaptable reference on the holding capacitor during the second switching cycle.

27. A system controller comprising:
a primary control module including a primary switch, the primary switch configured to transition between an off state and an on state; and
a secondary control module including a sense circuit, the sense circuit comprising:
an adaptable reference comparator configured to receive a secondary signal,
wherein the secondary signal transitions from a first amplitude to a second amplitude, greater than the first amplitude, in response to the primary switch transitioning from the on state to the off state and transitions to a third amplitude in response to ringing, and
wherein the adaptable reference comparator is configured to change state in response to the secondary signal transitioning to the second amplitude, to compare the secondary signal to an adaptable reference, to adapt whereby the adaptable reference comparator changes state in response to the primary switch transitioning from the on state to the off state, and to hold state in response to the secondary signal transitioning to the third amplitude.

28. The system controller of claim 27, wherein the secondary control module is configured to provide a coupling signal to the primary control module when the adaptable reference comparator changes state.

29. The system controller of claim 27, wherein the sense circuit is configured to provide a sense circuit output signal to the secondary control module when the adaptable reference comparator changes state.

30. The system controller of claim 27, wherein the adaptable reference is adapted to the second amplitude whereby the adaptable reference comparator holds state in response to secondary signal transitioning to the third amplitude.

31. The system controller of claim 27, wherein the sense circuit further comprises:
an edge detection circuit configured to provide an edge detection signal in response to an onset of a discontinuous mode.

32. The system controller of claim 27, wherein the sense circuit further comprises:
a clamp detection circuit configured to provide a clamp detection signal indicative of the primary switch operating in the on state.

33. The system controller of claim 27, wherein the sense circuit further comprises:
a top detection circuit configured to provide a signal indicative of tops of the secondary signal and synchronized with a ringing frequency of the secondary signal.

* * * * *